(12) United States Patent
Hopkins et al.

(10) Patent No.: US 11,393,672 B2
(45) Date of Patent: Jul. 19, 2022

(54) METHODS OF FORMING MICROELECTRONIC DEVICES INCLUDING AN INTERDECK REGION BETWEEN DECK STRUCTURES

(71) Applicant: Micron Technology, Inc., Boise, ID (US)

(72) Inventors: John D. Hopkins, Meridian, ID (US); Damir Fazil, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/789,168

(22) Filed: Feb. 12, 2020

(65) Prior Publication Data
US 2021/0249261 A1      Aug. 12, 2021

(51) Int. Cl.
| | |
|---|---|
| *H01L 27/11582* | (2017.01) |
| *H01L 21/28* | (2006.01) |
| *H01L 21/02* | (2006.01) |
| *H01L 21/311* | (2006.01) |
| *H01L 27/11524* | (2017.01) |

(52) U.S. Cl.
CPC .. *H01L 21/02164* (2013.01); *H01L 21/02532* (2013.01); *H01L 21/31111* (2013.01); *H01L 21/02271* (2013.01)

(58) Field of Classification Search
CPC ........... H01L 27/11573; H01L 21/0217; H01L 27/11524; H01L 21/02326
See application file for complete search history.

(56) References Cited

U.S. PATENT DOCUMENTS

| | | | |
|---|---|---|---|
| 10,388,665 B1 | 8/2019 | Xie et al. | |
| 10,446,578 B1 | 10/2019 | Howder et al. | |
| 2012/0276719 A1* | 11/2012 | Han ................ | H01L 27/11582 438/478 |
| 2015/0155296 A1* | 6/2015 | Yoon ................ | H01L 27/11582 257/324 |
| 2017/0229472 A1* | 8/2017 | Lu .................... | H01L 21/3003 |
| 2018/0019255 A1 | 1/2018 | Hopkins et al. | |
| 2018/0331117 A1* | 11/2018 | Titus ................ | H01L 27/11565 |
| 2020/0006373 A1* | 1/2020 | Kubo ............... | H01L 27/11582 |
| 2020/0051992 A1* | 2/2020 | Liu .................. | H01L 23/5329 |
| 2020/0402995 A1* | 12/2020 | Cheon .............. | H01L 23/5283 |

* cited by examiner

*Primary Examiner* — Brian Turner
(74) *Attorney, Agent, or Firm* — TraskBritt

(57) ABSTRACT

A method of forming a microelectronic device comprises forming openings in an interdeck region and a first deck structure, the first deck structure comprising alternating levels of a first insulative material and a second insulative material, forming a first sacrificial material in the openings, removing a portion of the first sacrificial material from the interdeck region to expose sidewalls of the first insulative material and the second insulative material in the interdeck region, removing a portion of the first insulative material and the second insulative material in the interdeck region to form tapered sidewalls in the interdeck region, removing remaining portions of the first sacrificial material from the openings, and forming at least a second sacrificial material in the openings. Related methods of forming a microelectronic devices and related microelectronic devices are disclosed.

23 Claims, 15 Drawing Sheets

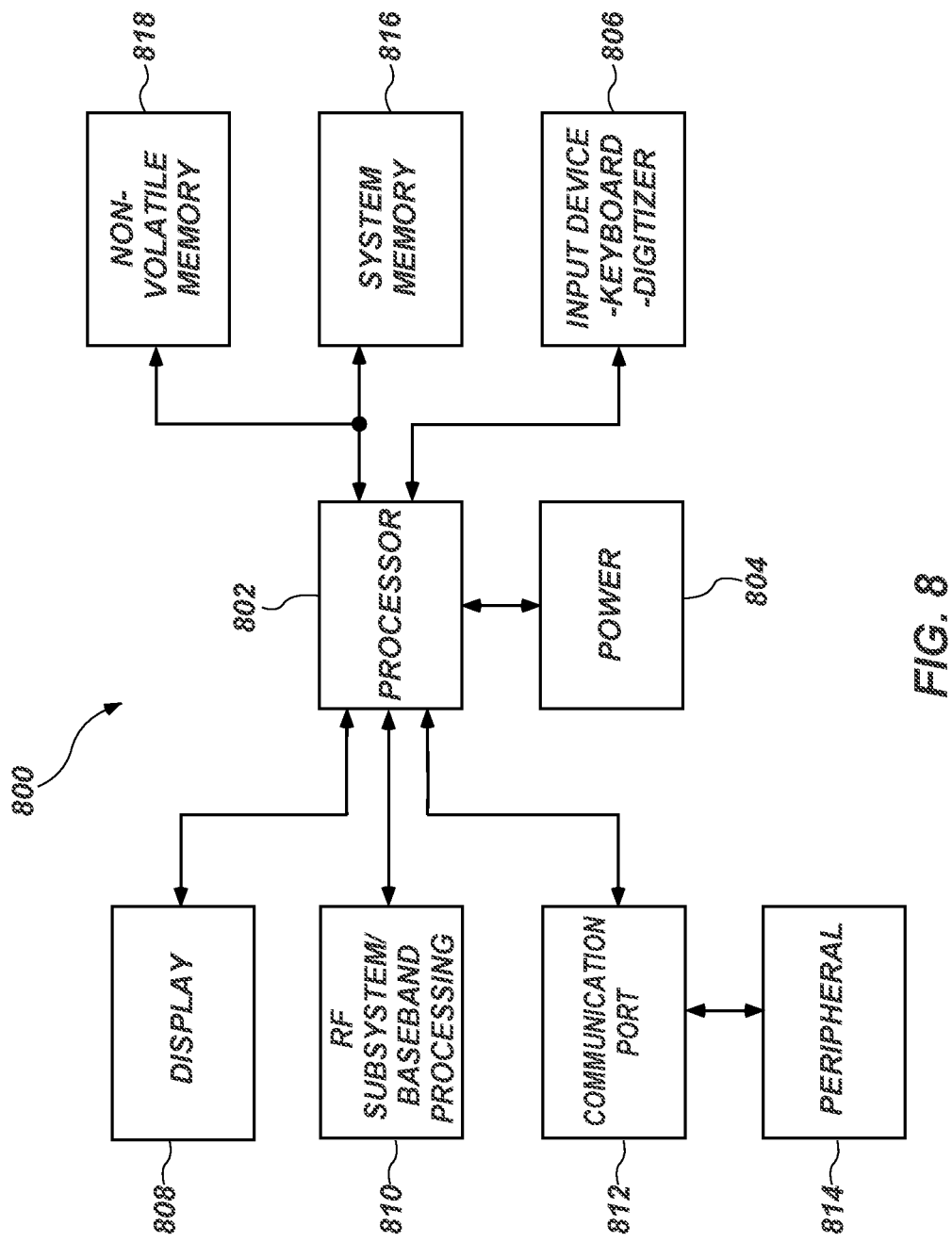

METHODS OF FORMING MICROELECTRONIC DEVICES INCLUDING AN INTERDECK REGION BETWEEN DECK STRUCTURES

TECHNICAL FIELD

The disclosure, in various embodiments, relates generally to the field of microelectronic device design and fabrication. More specifically, the disclosure relates to microelectronic devices including deck structures including one or more interdeck structures, through which strings of memory cells are formed, and to related electronic systems and methods.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes forming so-called "staircase" (or "stair step") structures at edges (e.g., horizontal ends) of the tiers of conductive structures. The staircase structures include individual "steps" providing contact regions of the conductive structures upon which conductive contact structures can be positioned to provide electrical access to the conductive structures.

As vertical memory array technology has advanced, additional memory density has been provided by forming vertical memory arrays to include additional tiers of conductive structures and, hence, additional staircase structures and/or additional steps in individual staircase structures associated therewith. As the number of memory cells in such vertical memory arrays increases, such as by increasing the number of memory cells in vertical strings of the vertical memory arrays, a depth (e.g., a height) of the stair step structure increases.

In some instances, additional memory density is provided by stacking deck structures one over another. Stacked deck structures generally require aligning an upper deck structure with a lower deck structure such that channel regions of the lower deck structure are aligned with the channel regions of the upper deck structure to facilitate continuity of the channel regions extending through the upper and lower deck structures. However, as the depth of the deck structures increases, the difficulty of aligning the channel regions of the upper and lower deck structures increases. For example, when forming openings in which the channel regions will be formed in the upper deck structure, the openings in the lower deck structure become exposed to various etch chemistries that may damage the lower deck structure. Exposure of the lower deck structure to etch chemistries intended to form channel openings in the upper deck structure may damage the lower deck structure and lead to failure of the microelectronic device.

BRIEF DESCRIPTION OF THE DRAWINGS

FIG. 8 is a processor-based system, in accordance with embodiments of the disclosure.

DETAILED DESCRIPTION

Figure 1A:
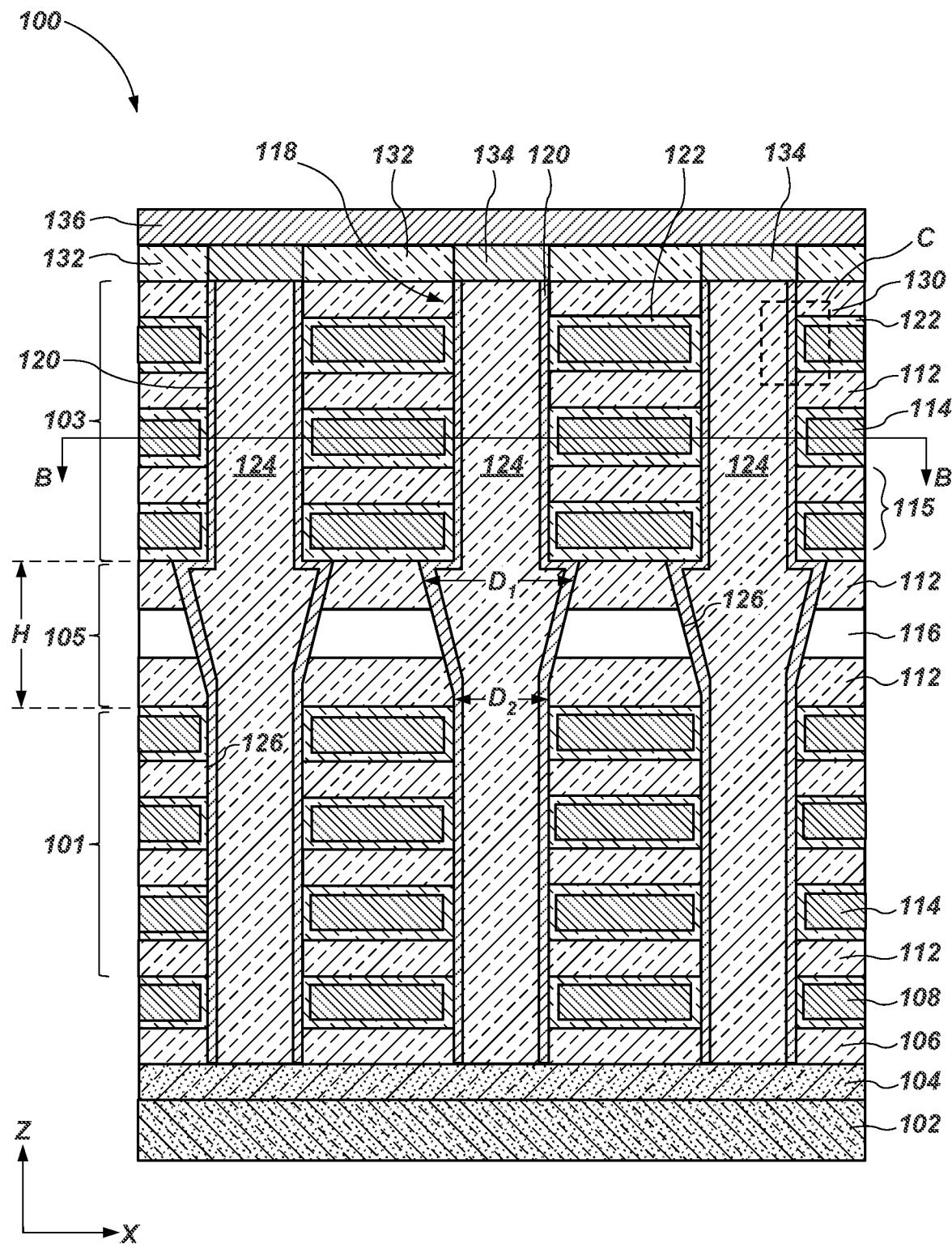
FIG. 1A is a simplified cross-sectional view of a microelectronic device, according to embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a memory device, such as a 3D NAND Flash memory device) or a complete microelectronic device including deck structures and an interdeck region between the deck structures. The structures described below do not form a complete microelectronic device. Only those process acts and structures necessary to understand the embodiments described herein are described in detail below. Additional acts to form a complete microelectronic device from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, an "electrically conductive material" refers to one or more of a metal, such as tungsten, titanium, niobium, vanadium, hafnium, tantalum, chromium, zirconium, iron, osmium, cobalt, nickel, iridium, platinum, palladium, ruthenium, rhodium, aluminum, copper, molybdenum, gold, a metal alloy, a metal-containing material (e.g., metal nitrides (titanium nitride, tantalum nitride, tungsten nitride, titanium aluminum nitride), metal silicides (tantalum silicides, tungsten silicides, nickel silicides, titanium silicides), metal carbides, metal oxides (iridium oxide, ruthenium oxide)), a conductively-doped semiconductor material (e.g., conductively-doped silicon, conductively-doped germanium, conductively-doped silicon germanium, etc.), polysilicon, other materials exhibiting electrical conductivity, or combinations thereof. Electrically conductive materials may include at least one of titanium nitride (TiN), tantalum nitride (TaN), tungsten nitride (WN), titanium aluminum nitride (TiAlN), elemental titanium (Ti), elemental platinum (Pt), elemental rhodium (Rh), elemental ruthenium (Ru), elemental molybdenum (Mo), elemental iridium (Ir), iridium oxide ($IrO_x$), elemental ruthenium (Ru), ruthenium oxide ($RuO_x$), elemental tungsten (W), aluminum (Al), elemental copper (Cu), elemental gold (Au), elemental silver (Ag), polysilicon, alloys thereof, or combinations thereof. The terms "electrically conductive material" and "conductive material" may be used interchangeably herein.

According to embodiments described herein, a microelectronic device includes a first deck structure, a second deck structure, and an interdeck region (e.g., interdeck structure) between the first deck structure and the second deck structure. Each of the first deck structure and the second deck structure may comprise tiers, each tier including an insulative material and a conductive material. Pillars comprising a channel material may extend through the second deck structure, the interdeck region, and the first deck structure. Intersections of the conductive materials of the tiers and the channel material may form a memory cell and the pillars may comprise strings of memory cells. The channel material may have a greater dimension (e.g., diameter) in the interdeck region than in the first deck structure or the second deck structure. The channel material exhibits a greater dimension proximate the second deck structure than proximate the first deck structure. In some embodiments, the channel material exhibits tapered (e.g., sloped, angled) sidewalls in the interdeck region. For example, the sidewalls of the channel material in the interdeck region may be oriented at an angle with respect to the sidewalls of the channel material in the first deck structure or the second deck structure.

The microelectronic device may be formed by forming a stack structure comprising alternating insulative materials and other materials (e.g., other insulative materials or conductive materials). The stack structure may include a first deck structure and an interdeck region. Openings may be formed through the first deck structure and the interdeck region at locations that will correspond to channel materials of the microelectronic device. After forming the openings, a dimension of the openings may be expanded within the interdeck region. In some embodiments, the openings are formed to have angled sidewalls within the interdeck region. In some embodiments, the openings exhibit a substantially uniform second diameter in the interdeck region that is larger than a first diameter of the openings in the first deck structure. After forming the larger openings in the interdeck region, at least a portion of the openings through the interdeck region and the first deck structure may be filled with one or more sacrificial materials. The one or more sacrificial materials may remain within the interdeck region and the first deck structure during formation of the second deck structure and during formation of openings within the second deck structure. The one or more sacrificial materials may protect the first deck structure from undesired damage during formation of the openings in the second deck structure. For example, the one or more sacrificial materials may exhibit an etch selectivity with respect to materials of the second deck structure and, therefore, may not be substantially removed during removal of material (e.g., formation of pillar openings) in the second deck structure. After forming the openings in the second deck structure, the one or more sacrificial materials may be removed from the interdeck region and the first deck structure. The openings may be filled with a channel material and, in some embodiments, an insulative material.

FIG. 1A is a simplified cross-sectional view of a microelectronic device 100, in accordance with embodiments of the disclosure. The microelectronic device 100 may include a stack structure including a first deck structure 101, a second deck structure 103 adjacent to (e.g., over) the first deck structure 101, and an interdeck region 105 between the first deck structure 101 and the second deck structure 103.

The microelectronic device 100 may include a base material 102 and a source structure 104 (e.g., a source material, a common source plate (CSP)) adjacent to (e.g., over) the base material 102. An etch stop material 106 may be adjacent to (e.g., over) the source structure 104. A select gate structure 108, which may comprise a select gate source (SGS) structure, may be adjacent to (e.g., over) the etch stop material 106.

The base material 102 may include a base material or a construction upon which additional materials are formed. The base material 102 may be a semiconductor substrate, a base semiconductor layer on a supporting structure, a metal electrode or a semiconductor substrate having one or more layers, structures or regions formed thereon. The base material 102 may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The base material 102 may be doped or undoped.

The source structure 104 may include, for example, a semiconductor material doped with one or more of P-type conductivity materials, N-type conductivity materials, or electrically conductive materials. As used herein, an N-type conductivity material may include, for example, polysilicon doped with at least one N-type dopant (e.g., arsenic ions, phosphorous ions, antimony ions). As used herein, a P-type conductivity material may include, for example, polysilicon doped with at least one P-type dopant (e.g., boron ions). In some embodiments, the source structure 104 includes N-type conductivity materials. In other embodiments, the source structure 104 comprises doped polysilicon, tungsten silicide, or another material.

The etch stop material 106 may comprise an electrically insulative material. By way of non-limiting example, the etch stop material 106 may include polysilicon, aluminum oxide, magnesium oxide (MgO), calcium oxide (CaO), or cerium oxide ($CeO_2$). In some embodiments, the etch stop material 106 comprises polysilicon.

The select gate structure 108 may comprise an electrically conductive material, such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the select gate structure 108 comprises polysilicon. In other embodiments, the select gate structure 108 comprises polysilicon.

The first deck structure 101 may be adjacent to (e.g., over) the select gate structure 108. The first deck structure 101 and the second deck structure 103 may each individually include alternating levels of an insulative material 112 and a conductive material 114. For example, the first deck structure 101 and the second deck structure 103 may include tiers 115, each tier 115 comprising a conductive material 114 and an insulative material 112.

Although FIG. 1A illustrates that the first deck structure 101 and the second deck structure 103 each individually include only a particular number of tiers 115, the disclosure is not so limited. In some embodiments, the first deck structure 101 and the second deck structure 103 each individually include a desired quantity of tiers 115, such as thirty-two (32) tiers 115. In other embodiments, the first deck structure 101 and the second deck structure 103 each individually include a different number of tiers 115, such as less than thirty-two (32) of the tiers 115 (e.g., less than or equal to thirty (30) of the tiers 115, less than or equal to twenty (20) of the tiers 115, less than or equal to ten (10) of the tiers 115); or greater than thirty-two (32) of the tiers 115 (e.g., greater than or equal to fifty (50) of the tiers 115, greater than or equal to one hundred (100) of the tiers 115) of the insulative material 112 and the conductive material 114.

The insulative materials 112 may include one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), tantalum oxide ($TaO_2$), magnesium oxide (MgO), aluminum oxide ($Al_2O_3$), or a combination thereof), and amorphous carbon. In some embodiments, the insulative material 112 is formed of and includes silicon dioxide.

The conductive materials 114 may comprise conductive lines, such as access lines (e.g., word lines) upon which electrically conductive contact structures are positioned to provide electrical access to the conductive structures. The conductive materials 114 may include an electrically conductive material, such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the conductive materials 114 comprise polysilicon. In other embodiments, the conductive materials 114 comprise tungsten. In some embodiments, the conductive materials 114 have the same material composition as the select gate structure 108. In some embodiments, the conductive materials 114 are referred to as gate electrodes or word lines.

The interdeck region 105 may include the insulative material 112 and an other insulative material 116. The other insulative material 116 may include one or more insulative materials exhibiting an etch selectivity with respect to the insulative materials 112 in the first deck structure 101 and the second deck structure 103. In some embodiments, the other insulative material 116 comprises a nitride material, such as silicon nitride. Although FIG. 1A illustrates that the interdeck region 105 includes only a particular number of the insulative materials 112 and the other insulative material 116, the disclosure is not so limited.

A height H of the interdeck region 105 may be within a range from about 20 nm to about 200 nm, such as from about 20 nm to about 50 nm, from about 50 nm to about 100 nm, from about 100 nm to about 150 nm, or from about 150 nm to about 200 nm. In some embodiments, the height H is about 70 nm.

Pillars 118 may extend through the second deck structure 103, the interdeck region 105, and the first deck structure 101. The pillars 118 may include a channel material 120 along sidewalls of the pillar 118. For example, the channel material 120 may extend along sides of the insulative materials 112 and along sides of a dielectric material 122, which may comprise a so-called tunnel dielectric material or a charge storage material, as will be described herein. In some embodiments, the pillars 118 further include an electrically insulative material 124, the channel material 120 arranged as an annular ring around the electrically insulative material 124.

The channel material 120 may extend to the source structure 104 and may be in electrical contact with the source structure 104. The channel material 120 may comprise, for example, polysilicon, which may be doped. However, the channel material 120 is not so limited and the channel material 120 may comprise other materials. In some embodiments, the electrically insulative material 124 may fill a remaining portion of the pillar 118.

The electrically insulative material 124 may comprise, for example, an oxide material (e.g., silicon dioxide ($SiO_2$), phosphosilicate glass, borosilicate glass, borophosphosilicate glass, fluorosilicate glass, titanium dioxide, hafnium oxide, zirconium dioxide, tantalum oxide, magnesium oxide, aluminum oxide, or a combination thereof), and amorphous carbon. In some embodiments, the insulative material 124 is formed of and includes silicon dioxide. In some embodiments, the electrically insulative material 124 has the same material composition as the insulative material 112.

The pillars 118 may include a variable dimension (e.g., diameter) within the interdeck region 105. For example, a diameter $D_2$ of the pillar 118 proximate the first deck structure 101 may be less than a diameter $D_1$ of the pillar 118 proximate the second deck structure 103. In some embodiments, the diameter $D_1$ may be from about 1.05 times to about 1.50 times the diameter $D_2$, such as from about 1.05 times to about 1.10 times, from about 1.10 times to about 1.20 times, from about 1.20 times to about 1.30 times, from about 1.30 times to about 1.40 times, or from about 1.40 times to about 1.50 times the diameter $D_2$. In some embodiments, the diameter $D_1$ is from about 120 nm to about 130 nm and the diameter $D_2$ is from about 100 nm to about 110 nm. In some embodiments, the diameters $D_1$, $D_2$ of the pillar 118 corresponds to the distance between opposing sidewalls of the insulative materials 112 and the dielectric materials 122 and the outer diameter of the channel material 120. The diameters $D_1$, $D_2$ of the pillar 118 may correspond to a distance between sidewalls 126 of the pillar 118.

In some embodiments, at least a portion of sidewalls 126 of the pillar 118 in the interdeck region 105 may be tapered (e.g., sloped, angled) with respect to a vertical axis (e.g., with respect to a plane perpendicular to a major surface of the base material 102), such as the z-axis. In some embodiments, at least a portion of sidewalls 126 of the pillar 118 in the interdeck region 105 may be oriented at an angle with respect to sidewalls 126 of the pillar 118 in the first deck structure 101 or sidewalls 126 of the pillar 118 in the second deck structure 103. In some embodiments, at least a portion of the sidewalls 126 in the interdeck region 105 may be angled at an angle from about 2° to about 15°, such as from about 2° to about 4°, from about 4° to about 7°, from about 7° to about 10°, or from about 10° to about 15° with respect to the sidewalls 126 of the channel material 120 in the first deck structure 101 and the second deck structure 103. In some embodiments, the sidewalls 126 within the interdeck region 105 may be substantially linear (e.g., not curved). In some such embodiments, the diameter of the pillar 118 may increase linearly along a length (in the z-direction) of the pillar 118 within the interdeck region 105. In some embodiments, the sidewalls 126 within the interdeck region 105 are oriented at an angle with respect to sidewalls of the dielectric materials 122, the insulative materials 112, and the conductive materials 114 within each of the first deck structure 101 and the second deck structure 103.

In some embodiments, the sidewalls 126 of the pillar 118 may be angled along a majority of the height H of the interdeck region 105. For example, the vertical height of the angled portions of the sidewalls 126 may be within a range from about 20 nm to about 200 nm, as described above with reference to the height H. In some embodiments, a portion of the sidewalls 126 of the interdeck region 105 may be oriented substantially vertically with respect to sidewalls 126 within the first deck structure 101 and the second deck structure 103 (e.g., may not be angled).

Accordingly, the diameter of the pillars 118 within the interdeck region 105 may be greater than the diameter of the pillars 118 within either of the first deck structure 101 or the second deck structure 103.

As will be described herein, forming the sidewalls 126 within the interdeck region 105 to be angled and forming the diameter $D_1$ proximate the second deck structure 103 to be larger than the diameter $D_2$ proximate the first deck structure 101 may facilitate improved alignment between the channel material 120 in the first deck structure 101 and the channel material 120 in the second deck structure 103.

With continued reference to FIG. 1A, memory cells 130 (illustrated in box C) may be located at intersections between the channel material 120 and the conductive materials 114. The dielectric material 122 may be located between the channel material 120 and the conductive materials 114. While illustrated as a single material, the dielectric material 122 may comprise a charge storage material comprising a so-called oxide-nitride-oxide (ONO) structure. The memory cells 130 may comprise the conductive material 114, the dielectric material 122, and the channel material 120.

Figure 1B:
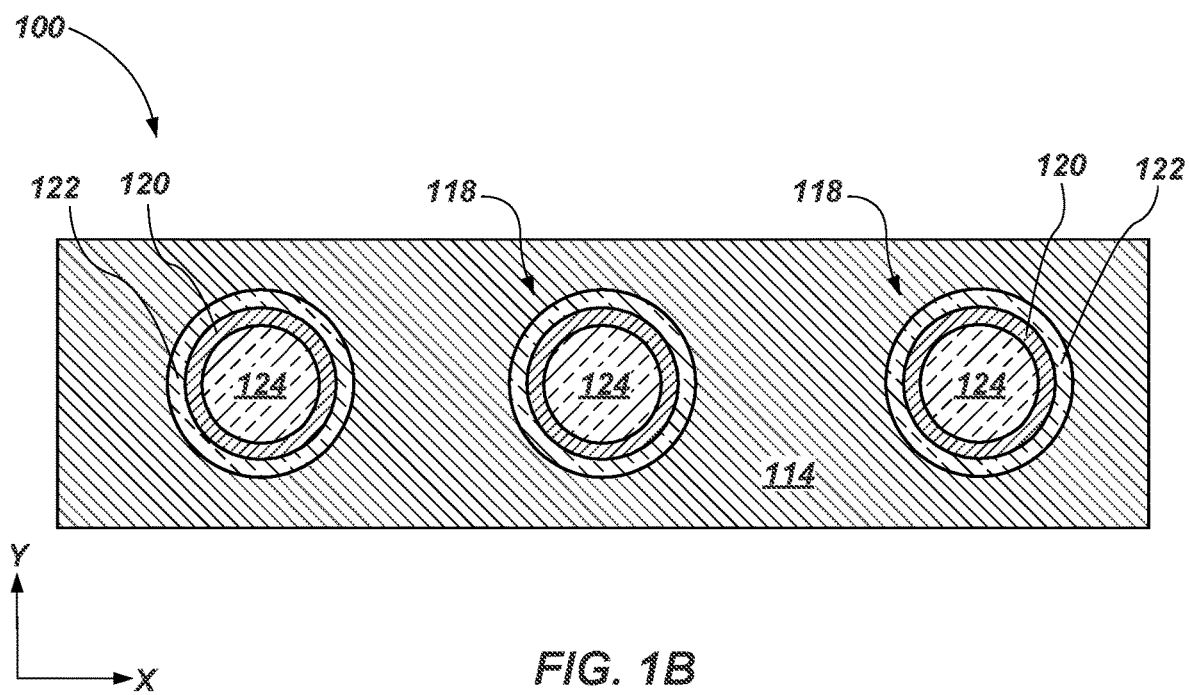
FIG. 1B is a simplified cross-sectional view of the microelectronic device of FIG. 1A taken through section line B-B of FIG. 1A.

FIG. 1B is a simplified cross-sectional view of the microelectronic device 100 taken through section line B-B of FIG. 1A through some of the memory cells 130. With reference to FIG. 1B, the memory cells 130 (and the pillars 118) may have a substantially circular cross-sectional shape. The memory cells 130 may include the channel material 120 around the insulative material 124, the dielectric material 122 around the channel material 120, and the conductive material 114 adjacent to the dielectric material 122. The dielectric material 122 may be directly between and contacting each of the channel material 120 and the conductive material 114.

Referring back to FIG. 1A, an insulative material 132 may be formed over the microelectronic device 100. The insulative material 132 may comprise, for example, silicon dioxide, silicon nitride, tetraethylorthosilicate, phosphosilicate glass (PSG), borosilicate glass (BSG), borophosphosilicate glass (BPSG), another insulative material, or combinations thereof. Openings may be formed in the insulative material 132 over the channel material 120 and may be filled with an electrically conductive material to form contacts 134. The contacts 134 may comprise an electrically conductive material, such as, for example, tungsten. A conductive line (e.g., a data line, such as a bit line) 136 may overlie and contact the contacts 134. The conductive line 136 may comprise an electrically conductive material, such as tungsten.

Although FIG. 1A illustrates a particular type of memory cell 130, the disclosure is not so limited. For example, one or more of the memory cells 130 may be replaced with one or more memory cells 140 illustrated in FIG. 1C, in the location of the memory cell 130 in box C of FIG. 1A. The memory cell 140 may include the channel material 120. In some embodiments, the memory cells 140 may be referred to herein as "charge trapping" memory cells.

The memory cell 140 may include an oxide-nitride-oxide (ONO) structure having a dielectric material 142 (e.g., a tunnel dielectric material), a charge trapping material 144, and a charge blocking material 146 between the channel material 120 and the conductive material 114. The charge trapping material 144 may be located directly between the dielectric material 142 and the charge blocking material 146. In some embodiments, the dielectric material 142 directly contacts the channel material 120 and the charge trapping material 144. The charge blocking material 146 may directly contact and may be located directly adjacent to the charge trapping material 144 and the conductive material 114.

Although the microelectronic device 100 has been described as including particular types of memory cells (e.g., memory cells 130 (FIG. 1A) and memory cells 140 (FIG. 1C)), the disclosure is not so limited and the microelectronic device 100 may include other types of memory cells. For example, in other embodiments, the memory cells 130 may include a dielectric barrier material (e.g., aluminum oxide, hafnium oxide, zirconium oxide) adjacent the conductive materials 114, a charge blocking material (e.g., silicon dioxide, aluminum oxide, hafnium oxide, zirconium oxide) adjacent the dielectric barrier material, a charge storage material (e.g., silicon nitride, silicon oxynitride, conductive nanodots) adjacent the charge blocking material, a tunneling material (e.g., silicon dioxide, aluminum oxide, hafnium oxide, zirconium oxide) adjacent the charge storage material, and the channel material 120 adjacent the tunneling material.

Figure 1C:
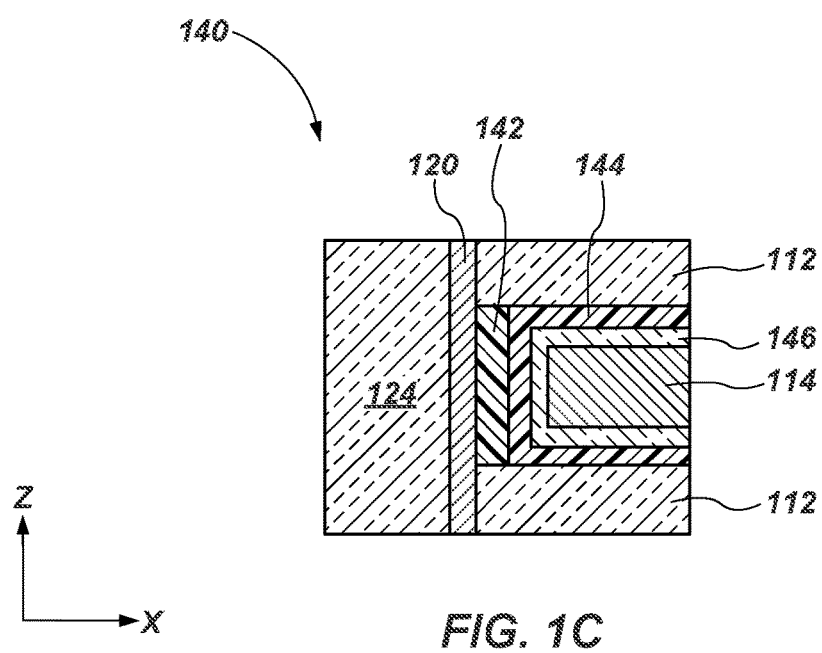
FIG. 1C is a simplified cross-sectional view of box C of the microelectronic device of FIG. 1A, in accordance with embodiments of the disclosure.

Although FIG. 1A and FIG. 1C illustrate the dielectric material 122, the dielectric material 142, the charge trapping material 144, and the charge blocking material 146 as extending around the conductive materials 114, the disclosure is not so limited. In other embodiments, the dielectric material 122, the dielectric material 142, the charge trapping material 144, and the charge blocking material 146 are substantially coextensive with the channel material 120 and extend through the second deck structure 103, the interdeck region 105, and the first deck structure 101.

Figure 2:
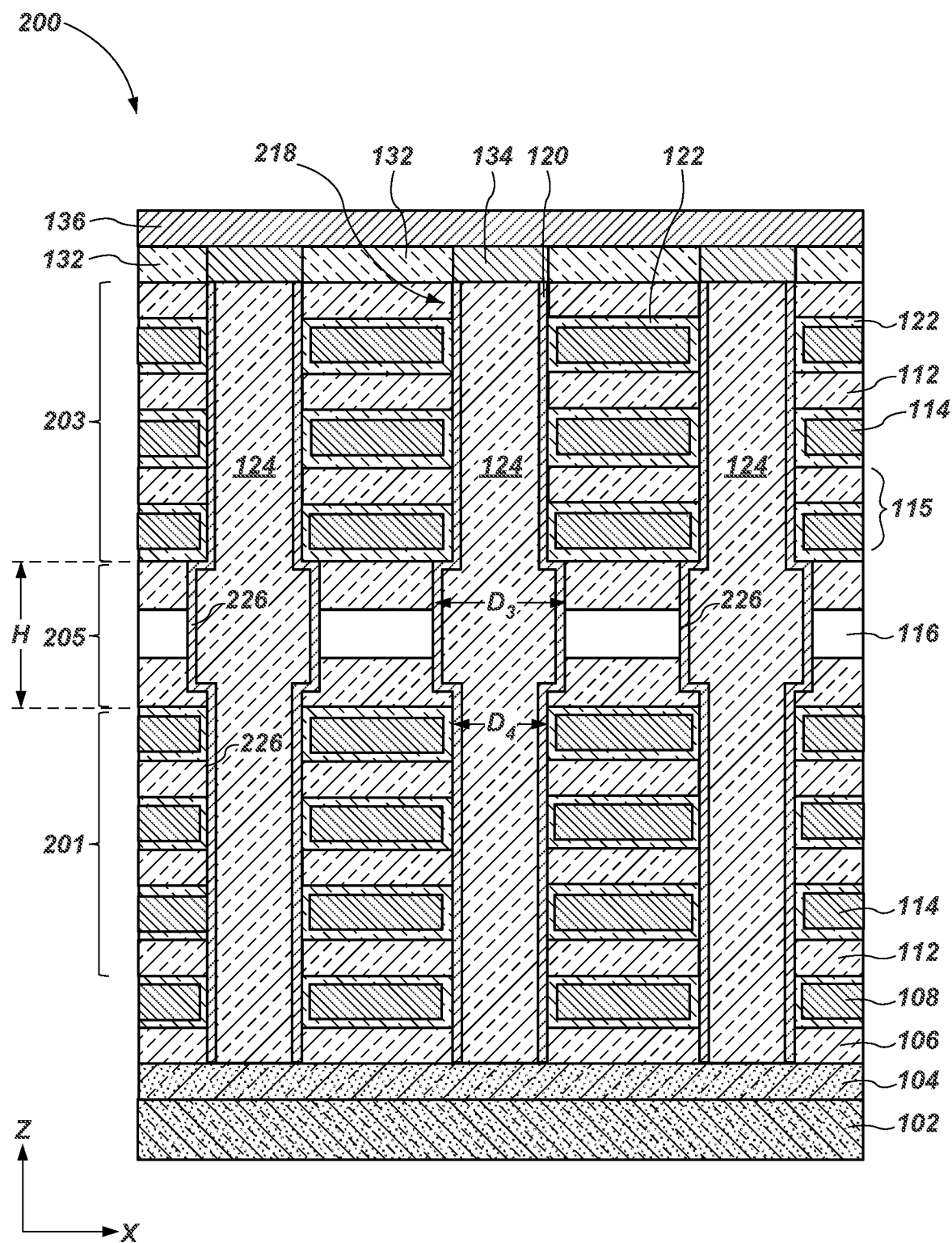
FIG. 2 is a simplified cross-sectional view of a microelectronic device, according to embodiments of the disclosure.

FIG. 2 is a simplified cross-sectional device of a microelectronic device 200, in accordance with other embodiments of the disclosure. The microelectronic device 200 may be substantially similar to the microelectronic device 100 of FIG. 1A through FIG. 1C, except that the microelectronic device 200 may include an interdeck region 205 that differs from the interdeck region 105 of FIG. 1A through FIG. 1C. The microelectronic device 200 may include a first deck structure 201 that is substantially similar to the first deck structure 101 of the microelectronic device 100 and a second deck structure 203 that is substantially similar to the second deck structure 103 of the microelectronic device 100.

The microelectronic device 200 may include pillars 218 substantially similar to the pillars 118 of FIG. 1A through FIG. 1C, except that the pillars 218 may not include tapered sidewalls 126. Rather, sidewalls 226 of the pillars 218 may be substantially vertically oriented within the interdeck region 205. In other words, the sidewalls 226 of the pillars 218 in the interdeck region 205 may be substantially parallel with the sidewalls 226 of the pillars 218 within the first deck structure 201 and the second deck structure 203.

The pillar 218 may exhibit a larger dimension (e.g., diameter) within the interdeck region 205. For example, a diameter $D_3$ of the pillar 218 proximate the second deck structure 203 may be larger than a diameter $D_4$ of the pillar 218 proximate the first deck structure 201. In some embodiments, the diameter $D_3$ may be from about 1.05 times to about 1.50 times the diameter $D_4$, such as from about 1.05 times to about 1.10 times, from about 1.10 times to about 1.20 times, from about 1.20 times to about 1.30 times, from about 1.30 times to about 1.40 times, or from about 1.40 times to about 1.50 times the diameter $D_4$. In some embodiments, the diameter $D_3$ is from about 120 nm to about 130 nm and the diameter $D_4$ is from about 100 nm to about 110 nm. The diameters $D_3$, $D_4$ correspond to the outside diameter of the channel material 120.

Although FIG. 1A and FIG. 2 illustrate that the channel material 120 comprises liner along sidewalls of the tiers 115, the disclosure is not so limited. In other embodiments, the channel material 120 may substantially fill the diameters $D_1$, $D_2$, $D_3$, $D_4$ and the pillars 118, 218 may not include the dielectric material 122. In some such embodiments, the pillars 118, 218 may comprise or consist essentially of the channel material 120.

Accordingly, in some embodiments, a microelectronic device comprises a first deck structure comprising alternating levels of an insulative material and a conductive material, an interdeck region adjacent to the first deck structure and comprising alternating levels of the insulative material and another insulative material, a second deck structure adjacent to the interdeck region and comprising alternating levels of the insulative material and the conductive material, and pillars comprising a channel material extending through the first deck structure, the interdeck region, and the second deck structure, sidewalls of the channel material within the interdeck region tapered with respect to the sidewalls of the channel material within the first deck structure and the second deck structure.

Figure 3A:
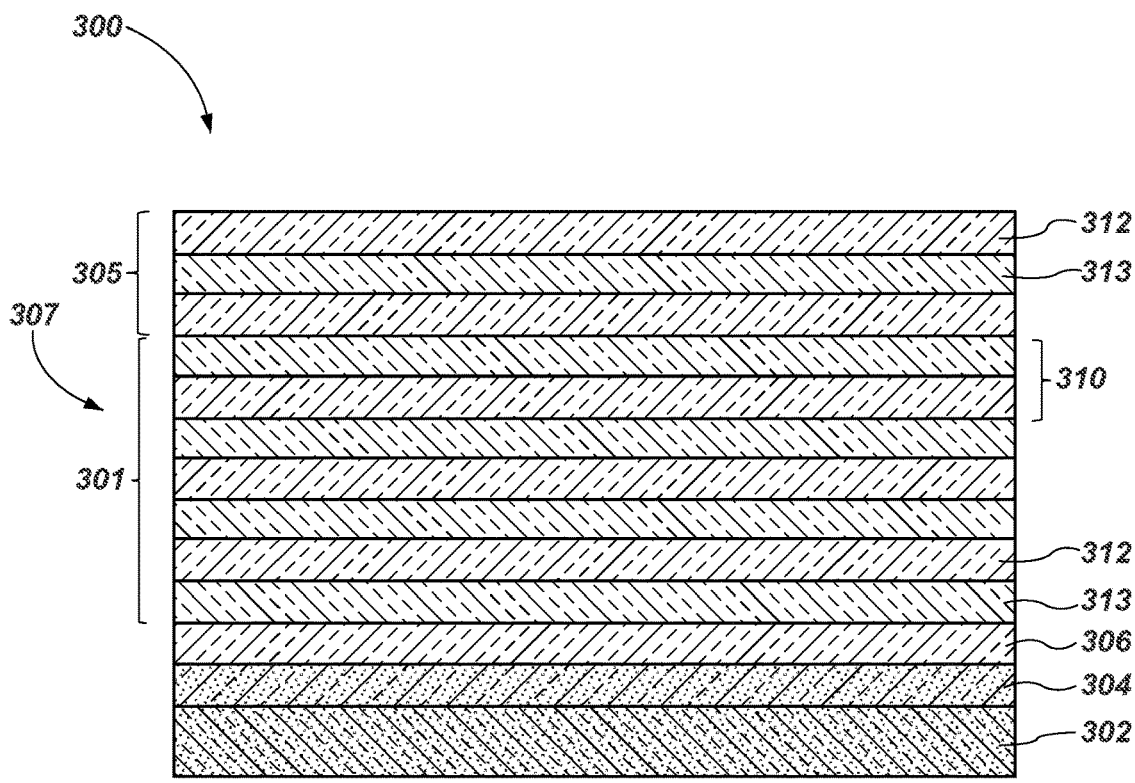
FIG. 3A through FIG. 3F are simplified cross-sectional views illustrating a method of forming a microelectronic device, in accordance with embodiments of the disclosure.

FIG. 3A through FIG. 3F are simplified cross-sectional views illustrating a method of forming a microelectronic device, such as the microelectronic device 100 of FIG. 1A through FIG. 1C, in accordance with embodiments of the disclosure. With reference to FIG. 3A, a microelectronic device structure 300 comprises a stack structure 307 comprising a base material 302, a source structure 304, an etch stop material 306, and a first deck structure 301 comprising tiers 310 of alternating levels of an insulative material 312 and another insulative material 313. Each tier 310 may comprise one level of the insulative material 312 and one level of the other insulative material 313.

Each of the base material 302, the source structure 304, the etch stop material 306, and the insulative materials 312 may comprise the same materials described above with reference to each of the respective base material 102 (FIG. 1A), the source structure 104 (FIG. 1A), the etch stop material 106 (FIG. 1A), and the insulative material 112 (FIG. 1A).

The other insulative material 313 may comprise a material exhibiting an etch selectivity with respect to the insulative material 312. In some embodiments, the other insulative material 313 comprises a nitride material, such as silicon nitride.

Figure 3B:
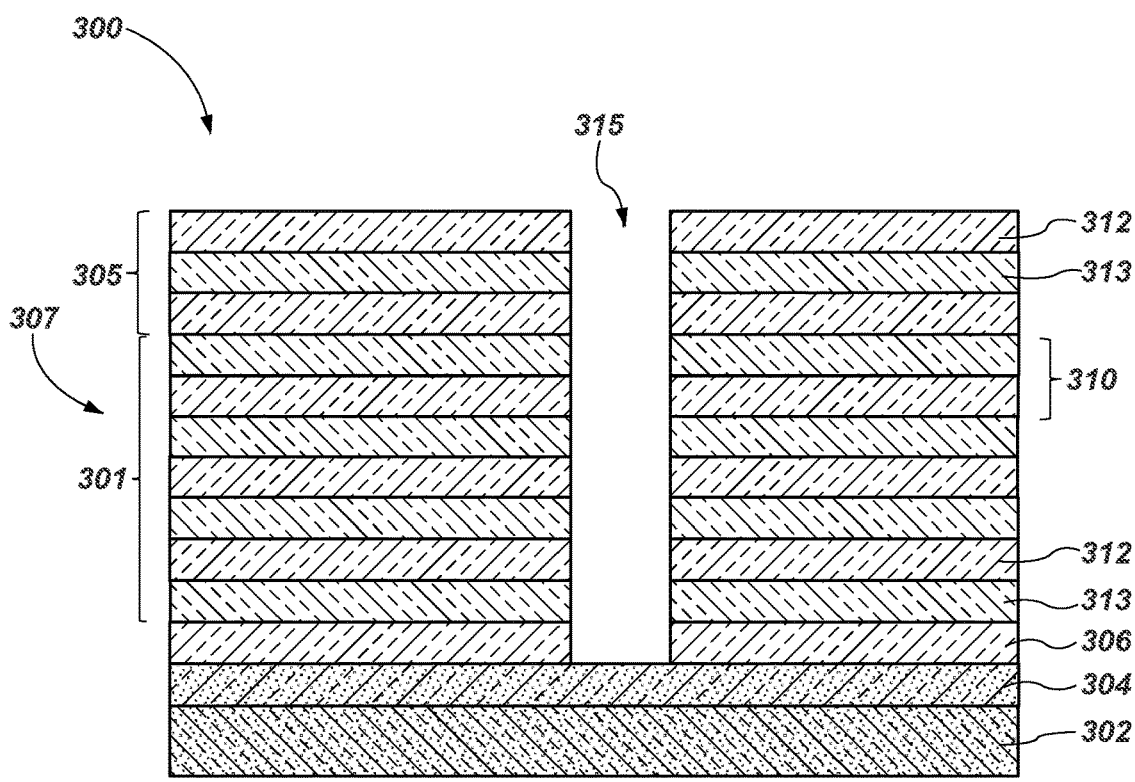

With reference to FIG. 3B, an opening 315 may be formed through a portion of the stack structure 307 to expose a portion of the source structure 304. The opening 315 may extend through the tiers 310 of the alternating levels of the insulative material 312 and the other insulative material 313. The opening 315 may be formed by forming a mask material over the microelectronic device structure 300 and forming an opening in the mask material at a location corresponding to the opening 315 to expose an uppermost level of the insulative material 312. The uppermost level of the insulative material 312 may be exposed to a dry etch chemistry, such as, for example, one or more of ion bombardment, a reactive ion etching (RIE) process, and another dry etching process through the opening in the mask material.

By way of nonlimiting example, portions of the insulative material 312 may be removed by exposing the insulative material 312 to a dry etchant comprising, for example, one or more of $CHF_3$, hexafluoroethane ($C_2F_6$), hexafluoropropene ($C_3F_6$), and hydrogen ($H_2$). Portions of the other insulative material 313 may be removed by exposing the other insulative material 313 to a dry etchant comprising one or more of (e.g., all of) oxygen ($O_2$), nitrogen ($N_2$), carbon tetrafluoride ($CF_4$), trifluorometane ($CHF_3$) (also referred to as fluoroform), ammonia ($NH_3$), and sulfur hexafluoride ($SF_6$). However, the disclosure is not so limited and the opening 315 may be formed by methods other than those described herein. The etch stop material 306 may be removed by exposing the etch stop material 306 to a wet etchant that is selective to the etch stop material 306 and does not substantially remove exposed portions of the microelectronic device structure 300. For example, the etch stop material 306 may be removed without substantially removing portions of the insulative material 312 or the other insulative material 313. The wet etchant may include, for example, hydrofluoric acid, phosphoric acid, another acid, or combinations thereof.

Figure 3C:
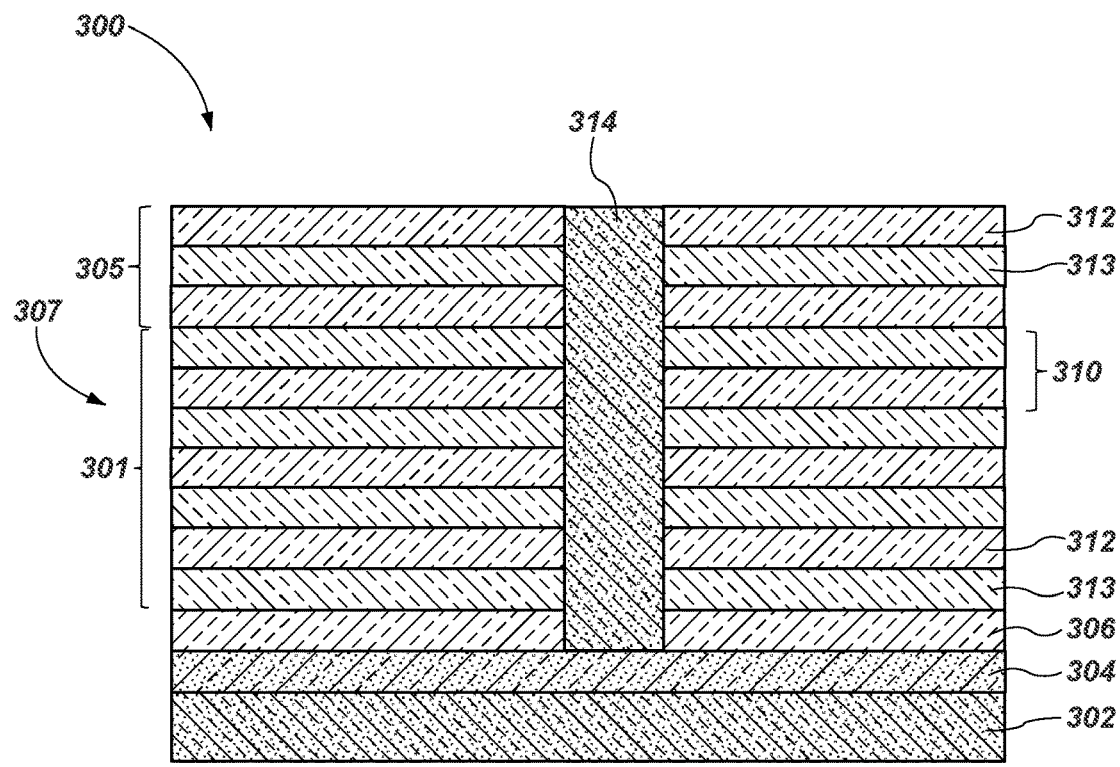

Referring to FIG. 3C, a first sacrificial material 314 may be formed within the opening 315 (FIG. 3B). The first sacrificial material 314 be formed by, for example, ALD, CVD, PVD, PECVD, or LPCVD. After forming the first sacrificial material 314, portions of the first sacrificial material 314 over surfaces of the microelectronic device structure 300 outside of the opening 315 (e.g., over surfaces of the uppermost insulative material 312) may be removed, such as by chemical mechanical planarization (CMP) to expose surfaces of the uppermost insulative material 312.

The first sacrificial material 314 may exhibit an etch selectivity with respect to the insulative material 312 and the other insulative material 313. The first sacrificial material 314 may comprise one or more of a mask material, a photoresist material, a material comprising carbon (e.g., a spin on carbon (SoC) material), and aluminum oxide. In some embodiments, the first sacrificial material 314 comprises carbon, such as spin on carbon.

Figure 3D:
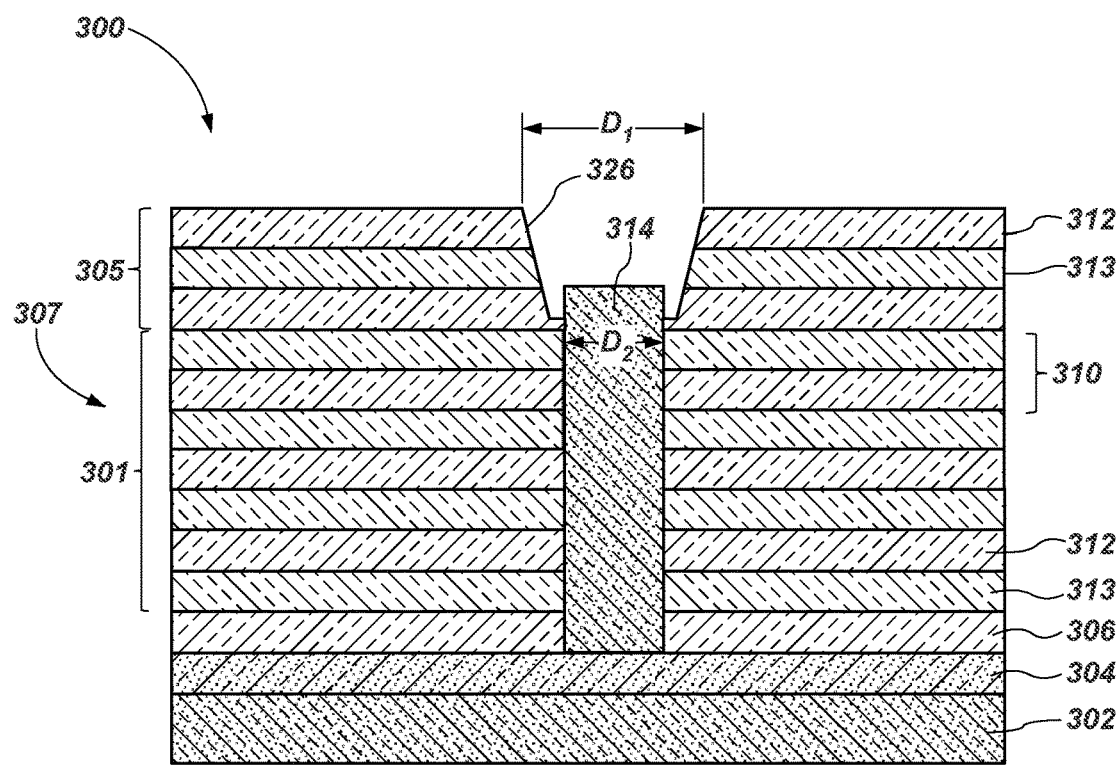

With reference to FIG. 3D, a portion of the first sacrificial material 314 may be recessed within the opening 315 (FIG. 3B) and a portion of the insulative material 312 and other insulative materials 313 in the interdeck region 305 may be removed in the lateral direction (left to right in the view illustrated in FIG. 3D). The microelectronic device structure 300 may be exposed to a so-called "descumming" process wherein the microelectronic device structure 300 is exposed to a fluorinated plasma to substantially remove remnants of the first sacrificial material 314 at locations corresponding to the opening 315 (FIG. 3B) without substantially removing other portions of the first sacrificial material 314.

The first sacrificial material 314 may be recessed by, for example, exposing the first sacrificial material 314 to a dry etching comprising one or both of oxygen and nitrogen ($N_2$). In some embodiments, the first sacrificial material 314 is exposed to oxygen to remove at least a portion thereof and recess the first sacrificial material 314 with respect to the insulative material 312 and the other insulative material 313.

After recessing the first sacrificial material 314, exposed sidewalls of the insulative material 312 and the other insulative material 313 may be exposed to a dry etchant to form tapered sidewalls 326. By way of nonlimiting example, the sidewalls of the insulative material 312 and the other insulative material 313 may be exposed to a dry etchant comprising one or more of $CF_4$, $CHF_3$, $NH_3$, $SF_6$, $C_2F_6$, $C_3F_6$, and $H_2$. However, the disclosure is not so limited and the tapered sidewalls 326 may be formed by methods other than those described. Forming the tapered sidewalls 326 may include the diameter of the sidewalls 326 from diameter $D_2$ to a larger diameter $D_1$. The tapered sidewalls 326 may be angled at an angle from about 2° to about 15°, such as from about 2° to about 4°, from about 4° to about 7°, from about 7° to about 10°, or from about 10° to about 15° with respect to sidewalls of the first sacrificial material 314 in the first deck structure 301, as described above with reference to the tapered sidewalls 126 (FIG. 1A).

Figure 3E:
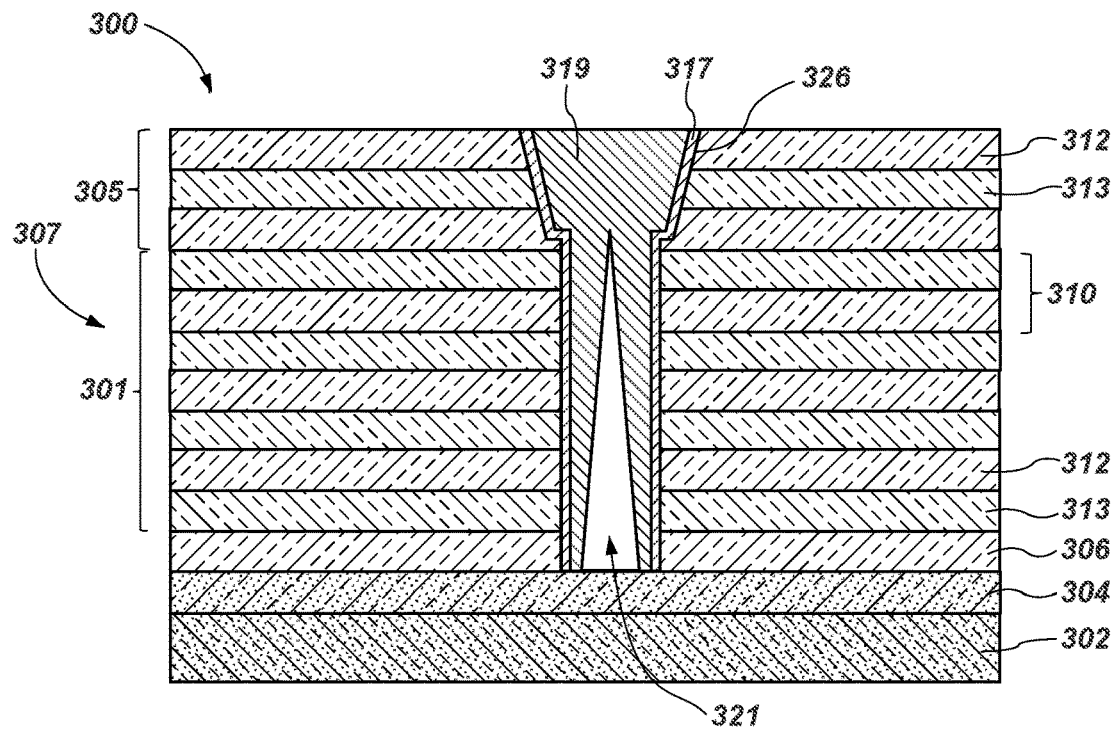

Referring to FIG. 3E, after forming the tapered sidewalls 326, the first sacrificial material 314 (FIG. 3D) may be removed. For example, the first sacrificial material 314 may be exposed to a dry etchant comprising oxygen to remove the first sacrificial material 314 from the opening 315 without substantially removing the insulative material 312 or the other insulative material 313.

A second sacrificial material 317 (which may also be referred to herein as a "sacrificial liner") may be formed within the opening left after removal of the first sacrificial material 314 (FIG. 3D). In some embodiments, the second sacrificial material 317 is formed sub-conformally within the opening 315. Stated another way, the second sacrificial material 317 may not conformally overlie substantially all exposed surfaces within the opening 315 or substantially fill the entire opening 315. By way of example only, the second sacrificial material 317 may be conformally formed on the sidewalls of the insulative material 312 and the other insulative material 313 in the first deck structure 301 and the interdeck region 305 (and may not be formed over laterally extending surfaces of the source structure 304). The second sacrificial material 317 may be formed by one or more of ALD, CVD, PVD, PECVD, and LPCVD. In some embodiments, the second sacrificial material 317 comprises titanium nitride.

After forming the second sacrificial material 317 within the opening 315, a third sacrificial material 319 may be formed over the second sacrificial material 317 and within the opening 315. The third sacrificial material 319 may comprise, for example, tungsten. In some embodiments, the third sacrificial material 319 is formed sub-conformally within the opening 315 such that a void 321 is formed. Stated another way, the third sacrificial material 319 may not conformally overlie substantially all surfaces of the opening and may not substantially fill the entire opening. In other words, a portion of the opening 315 (e.g., the void 321) may be substantially free of the third sacrificial material 319. For example, a portion of the opening 315 may remain free of the second sacrificial material 317 and the third sacrificial material 319.

After forming the second sacrificial material 317 and the third sacrificial material 319, portions of the second sacrificial material 317 and the third sacrificial material 319 outside of the opening may be removed. For example, the microelectronic device structure 300 may be exposed to a CMP process to remove portions of the second sacrificial material 317 and the third sacrificial material 319 from surfaces of the uppermost insulative material 312.

Figure 3F:
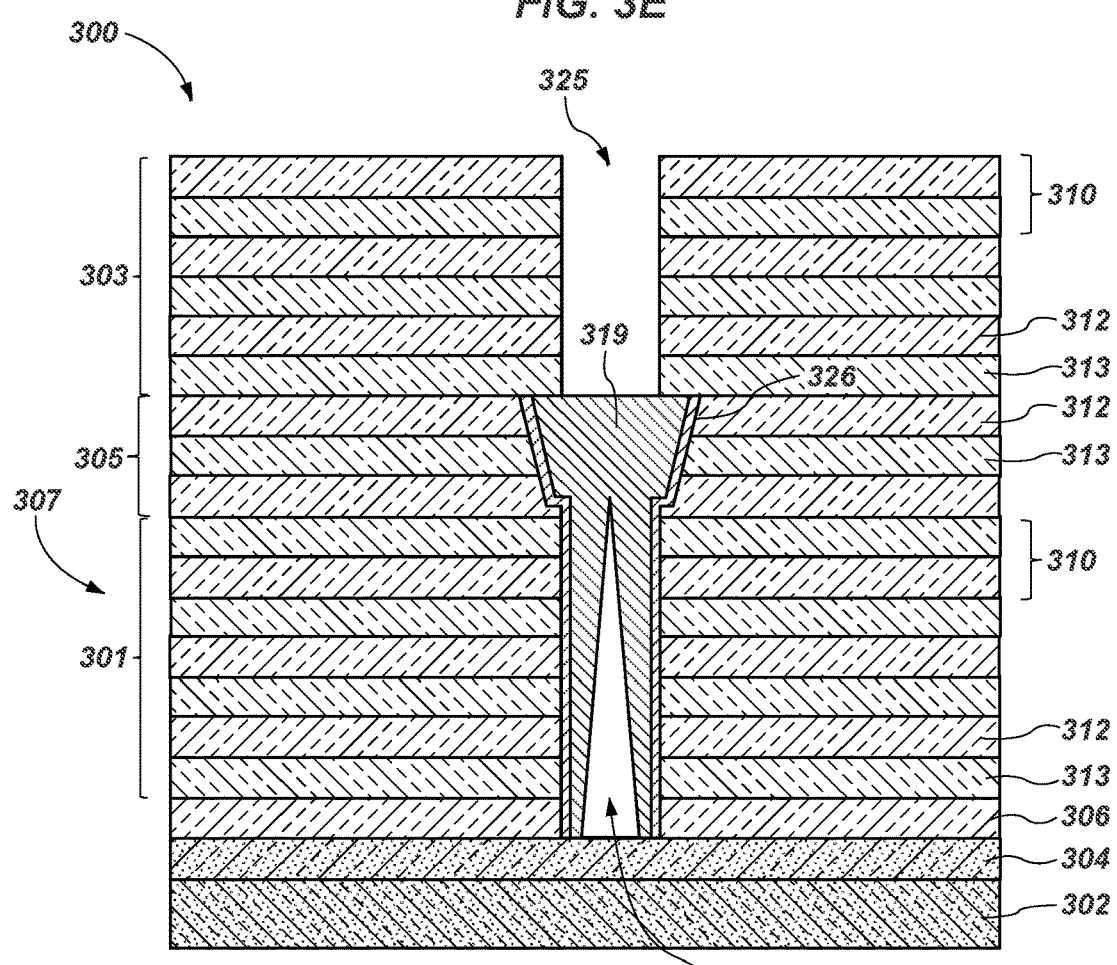

Referring to FIG. 3F, a second deck structure 303 may be formed adjacent to (e.g., over) the interdeck structure 305. The second deck structure 303 may include tiers 310 of the insulative material 312 and the other insulative material 313. After forming the second deck structure 303, an opening 325 may be formed through the tiers 310 of the second deck structure 303. The opening 325 may be formed in substantially the same manner as formation of the opening 315 (FIG. 3B).

The second sacrificial material 317 and the third sacrificial material 319 within the first deck structure 301 may protect the materials within the first deck structure 301 from undesired damage during formation of the opening 325 in the second deck structure 303. For example, since the openings 315 (FIG. 3B) of the first deck structure 301 include the second sacrificial material 317 and the third sacrificial material 319, the insulative material 312 and the other insulative material 313 of the first deck structure 301 may not be substantially damaged during formation of the openings 325 in the second deck structure 303. In addition, the increased diameter $D_1$ in an upper portion of the interdeck region 305 proximate the second deck structure 303 relative to proximate the first deck structure 301 may protect undesired damage of the underlying materials of the first deck structure 301. The increased diameter in the interdeck region 305 may facilitate alignment of the openings 325 of the second deck structure 303 with the previously formed openings 315 of the first deck structure 301. By way of comparison, openings in a second deck structure of a conventional microelectronic device may be formed without forming materials corresponding to a second sacrificial material or third sacrificial material in an adjacent first deck structure or interdeck region of the conventional microelectronic device. The exposed materials of the first deck structure of the conventional microelectronic device may be damaged during formation of the openings in the second deck structure, which may ultimately lead to device failure of the conventional microelectronic device.

After forming the opening 325 in the second deck structure 303, the microelectronic device structure 300 may be exposed to additional processing acts to form the microelectronic device 100 of FIG. 1A through FIG. 1C. For example, the third sacrificial material 319 and the second sacrificial material 317 may be removed from the first deck structure 301 through the opening 325. The third sacrificial material 319 and the second sacrificial material 317 may be removed by exposing the third sacrificial material 319 and the second sacrificial material 317 to a wet etchant, such as one or more of hydrofluoric acid, nitride acid, ammonium hydroxide, hydrogen peroxide, acetic acid, and water. However, the disclosure is not so limited and the third sacrificial material 319 and the second sacrificial material 317 may be removed using etch chemistries other than those described.

After removing the third sacrificial material 319 and the second sacrificial material 317, a channel material (e.g., the channel material 120 (FIG. 1A)) may be formed within the opening 325 extending through the second deck structure 303, the interdeck region 305, and the first deck structure 301. An electrically insulative material (e.g., the electrically insulative material 124 (FIG. 1A)) may be formed within the openings remaining between the channel material to form pillars (e.g., pillars 118 (FIG. 1A)).

In some embodiments, openings, which may be referred to as "slits" (not shown) may be formed through the second deck structure 303, the interdeck structure 305, and the first deck structure 301. After forming the slits, the other insulative materials 313 may be removed, such as by exposing the other insulative materials 313 to a wet etch chemistry through the slits. The wet etch chemistry may comprise, for example, nitric acid. After removing the other insulative materials 313, a dielectric material (e.g., the dielectric material 122 (FIG. 1A)) may be formed in at least some of the spaces left by removal of the other insulative materials 313. A conductive material (e.g., the conductive material 114 (FIG. 1A)) may be formed adjacent to the dielectric material 122 to form memory cells (e.g., memory cells 130 (FIG. 1A)). In other embodiments, memory cells, such as the memory cells 140 (FIG. 1C) may be formed rather than the memory cells 130. Since the other insulative materials 313 are removed and replaced with the conductive material, the process may be referred to herein as a so-called "replacement gate" process.

After forming the memory cells, an insulative material (e.g., insulative material 132 (FIG. 1A)) may be formed over the microelectronic device structure 300. Openings may be formed in the insulative material at locations corresponding to the pillars (e.g., pillars 118 (FIG. 1A)) and filled with a conductive material to form conductive contacts (e.g., conductive contacts 134 (FIG. 1A)) adjacent (e.g., over) the electrically insulative material 124. A conductive line (e.g., conductive line 136 (FIG. 1A)) may be formed over the insulative material 132 and may be electrically connected to the conductive contacts 134 to form the microelectronic device 100 of FIG. 1A.

Accordingly, in some embodiments, a method of forming a microelectronic device comprises forming openings in an interdeck region and a first deck structure, the first deck structure comprising alternating levels of a first insulative material and a second insulative material, forming a first sacrificial material in the openings, removing a portion of the first sacrificial material from the interdeck region to expose sidewalls of the first insulative material and the second insulative material in the interdeck region, removing a portion of the first insulative material and the second insulative material in the interdeck region to form tapered sidewalls in the interdeck region, removing remaining portions of the first sacrificial material from the openings, and forming at least a second sacrificial material in the openings.

Figure 4A:
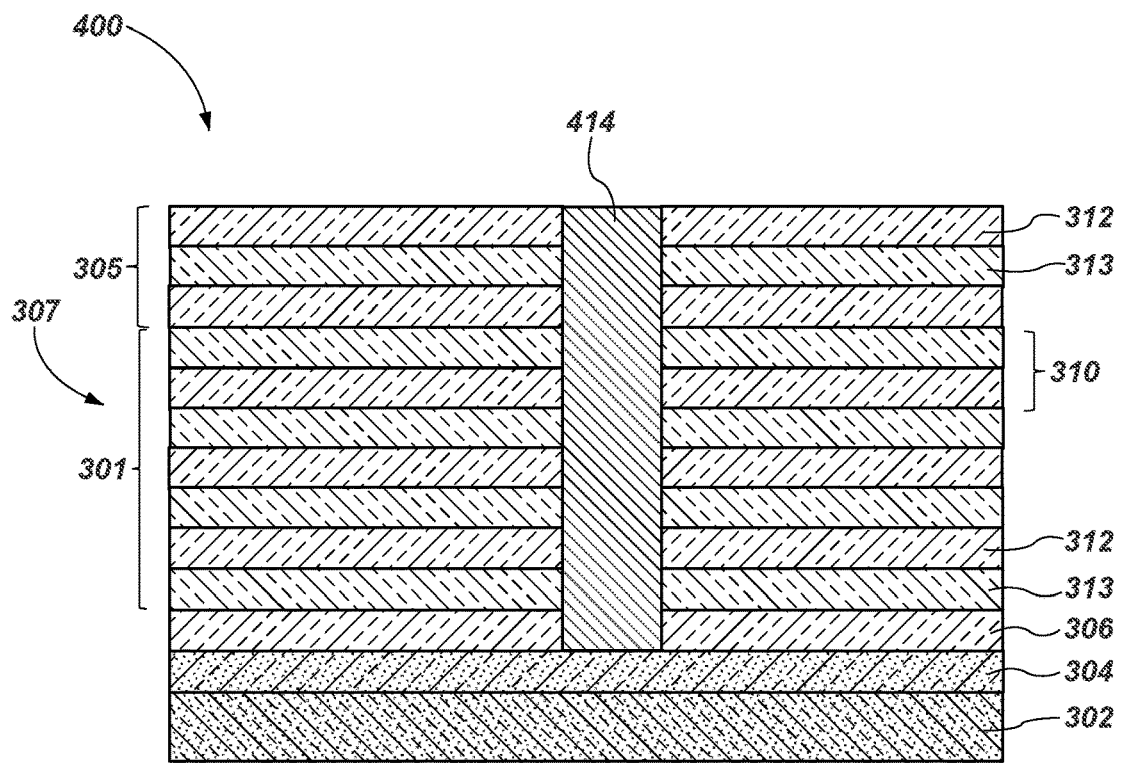
FIG. 4A through FIG. 4D are simplified cross-sectional views illustrating a method of forming a microelectronic device, in accordance with other embodiments of the disclosure.

FIG. 4A through FIG. 4D are simplified cross-sectional views illustrating a method of forming a microelectronic device structure 400, in accordance with embodiments of the disclosure. With reference to FIG. 4A, a microelectronic device structure 400 may be formed to be substantially the same as the microelectronic device structure 300 described above with reference to FIG. 3C, except that the microelectronic device structure 400 includes a first sacrificial material 414 that may be different than the first sacrificial material 314. The first sacrificial material 414 may comprise, for example, aluminum oxide ($Al_2O_3$). In other embodiments, the first sacrificial material 414 comprises tungsten. In yet other embodiments, the first sacrificial material 414 comprises polysilicon or titanium nitride.

Figure 4B:
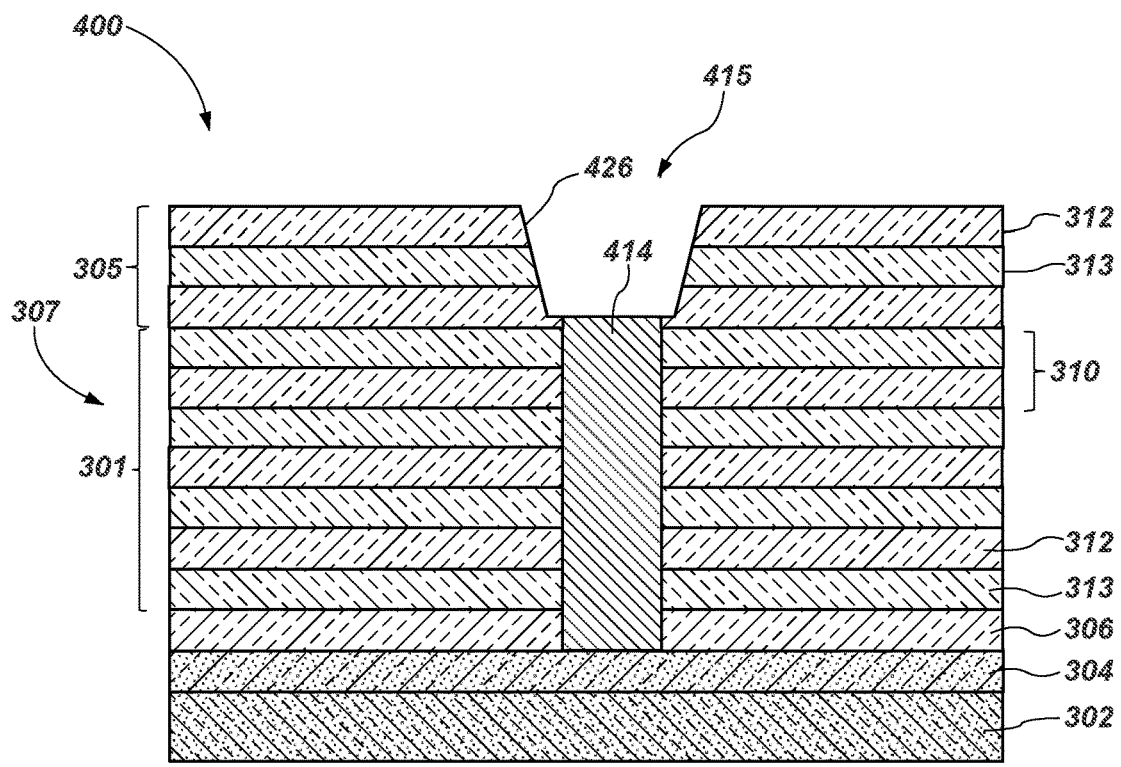

With reference to FIG. 4B, a portion of the first sacrificial material 414 within the interdeck region 305 may be removed to form an opening 415 defined by tapered sidewalls 426. The tapered sidewalls 426 may be substantially the same as the tapered sidewalls 326 described above with reference to FIG. 3D and may be oriented at an angle from about 2° to about 15°, such as from about 2° to about 4°, from about 4° to about 7°, from about 7° to about 10°, or from about 10° to about 15° with respect to sidewalls of the first sacrificial material 414 in the first deck structure 301.

By way of non-limiting example, the first sacrificial material 414 may be removed by exposing the first sacrificial material 414 to a dry etchant comprising one or more of $CF_4$, oxygen, $BCl_3$, $Cl_2$, $CCl_4$, $SiCl_4$, and argon. In some embodiments, an upper portion of the first sacrificial material 414 extends above an interface between the first deck structure 301 and the interdeck region 305.

Figure 4C:
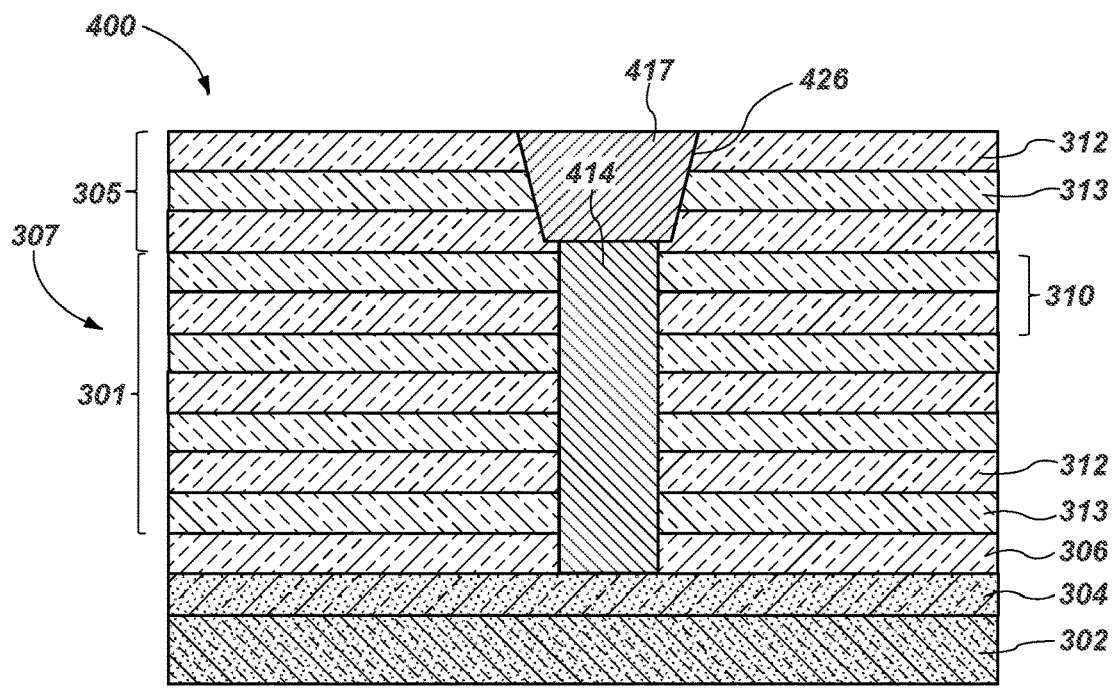

Referring to FIG. 4C, the opening 415 (FIG. 4B) may be filled with a second sacrificial material 417. The second sacrificial material 417 may exhibit an etch selectivity with respect to the first sacrificial material 414. In some embodiments, the second sacrificial material 417 comprises tungsten. In other embodiments, the second sacrificial material 417 comprises polysilicon.

Portions of the second sacrificial material 417 on surfaces of the uppermost insulative material 312 may be removed, such as by CMP.

Figure 4D:
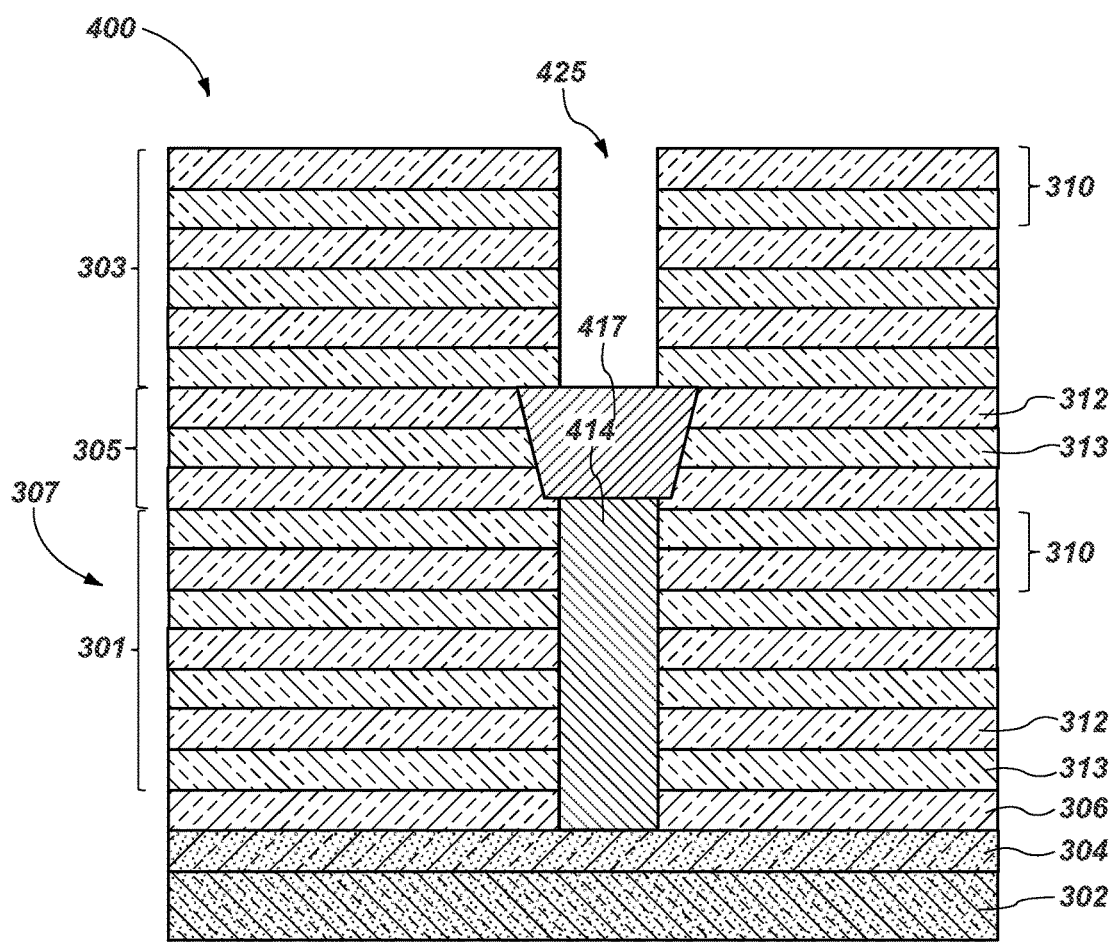

With reference to FIG. 4D, a second deck structure 303 may be formed adjacent to (e.g., over) the interdeck structure 305, as described above with reference to FIG. 3F. After forming the second deck structure 303, an opening 425 may be formed through the tiers 310 of the second deck structure 303. The opening 425 may be formed in substantially the same manner as formation of the opening 315 (FIG. 3B).

The first sacrificial material 414 and the second sacrificial material 417 within the first deck structure 301 and the interdeck region 305 may protect the materials within the first deck structure 301 from undesired damage during formation of the opening 425 in the second deck structure 303, as described above with reference to FIG. 3F.

After forming the opening 425 in the second deck structure 303, the microelectronic device structure 400 may be exposed to additional processing acts to form the microelectronic device 100 of FIG. 1A. For example, the first sacrificial material 414 and the second sacrificial material 417 may be removed from the first deck structure 301 through the opening 425. The second sacrificial material 417 may be removed by exposing the second sacrificial material 417 to one or more of ammonium hydroxide, hydrogen peroxide, water, hydrofluoric acid, and nitric acid. The first sacrificial material 414 may be removed by exposing the first sacrificial material 414 to one or more of phosphoric acid, hydrochloric acid, and acetic acid.

After removing the first sacrificial material 414 and the second sacrificial material 417, a microelectronic device, such as the microelectronic device 100 of FIG. 1A may be formed as described above with reference to FIG. 3F. For example, slits (not shown) may be formed through the second deck structure 303, the interdeck structure 305, and the first deck structure 301. After forming the slits, the insulative materials 312 may be removed, such as by exposing the insulative materials 312 to a wet etch chemistry through the slits. The wet etch chemistry may comprise, for example, nitric acid. After removing the insulative materials 312, a dielectric material (e.g., the dielectric material 122 (FIG. 1A)) may be formed in at least some of the spaces left by removal of the insulative materials 312. A conductive material (e.g., the conductive material 114 (FIG. 1A)) may be formed adjacent to the dielectric material to form memory cells (e.g., memory cells 130 (FIG. 1A)). In other embodiments, memory cells, such as the memory cells 140 (FIG. 1C) may be formed rather than the memory cells 130. Since the insulative materials 312 are removed and replaced with the conductive material, the process may be referred to herein as a so-called "replacement gate" process.

After forming the memory cells, an insulative material (e.g., insulative material 132 (FIG. 1A)) may be formed over the microelectronic device structure 300. Openings may be formed in the insulative material at locations corresponding to the pillars (e.g., pillars 118 (FIG. 1A)) and filled with a conductive material to form conductive contacts (e.g., conductive contacts 134 (FIG. 1A)). A conductive line (e.g., conductive line 136 (FIG. 1A)) may be formed over the insulative material and may be electrically connected to the conductive contacts to form the microelectronic device 100 of FIG. 1A.

Accordingly, in at least some embodiments, a method of forming a microelectronic device comprises forming a first sacrificial material in an opening extending through an interdeck region and a first deck structure, the interdeck region and the first deck structure comprising alternating first insulative materials and second insulative materials, recessing the first sacrificial material in the interdeck region and a portion of the first insulative materials and the second insulative materials in the interdeck region to form a recessed portion in the interdeck region having a diameter larger than a diameter of the opening in the first deck structure, filling the recess in the interdeck region with a second sacrificial material, and forming a second deck structure over the interdeck region and forming an opening through the second deck structure to expose the second sacrificial material.

Figure 5A:
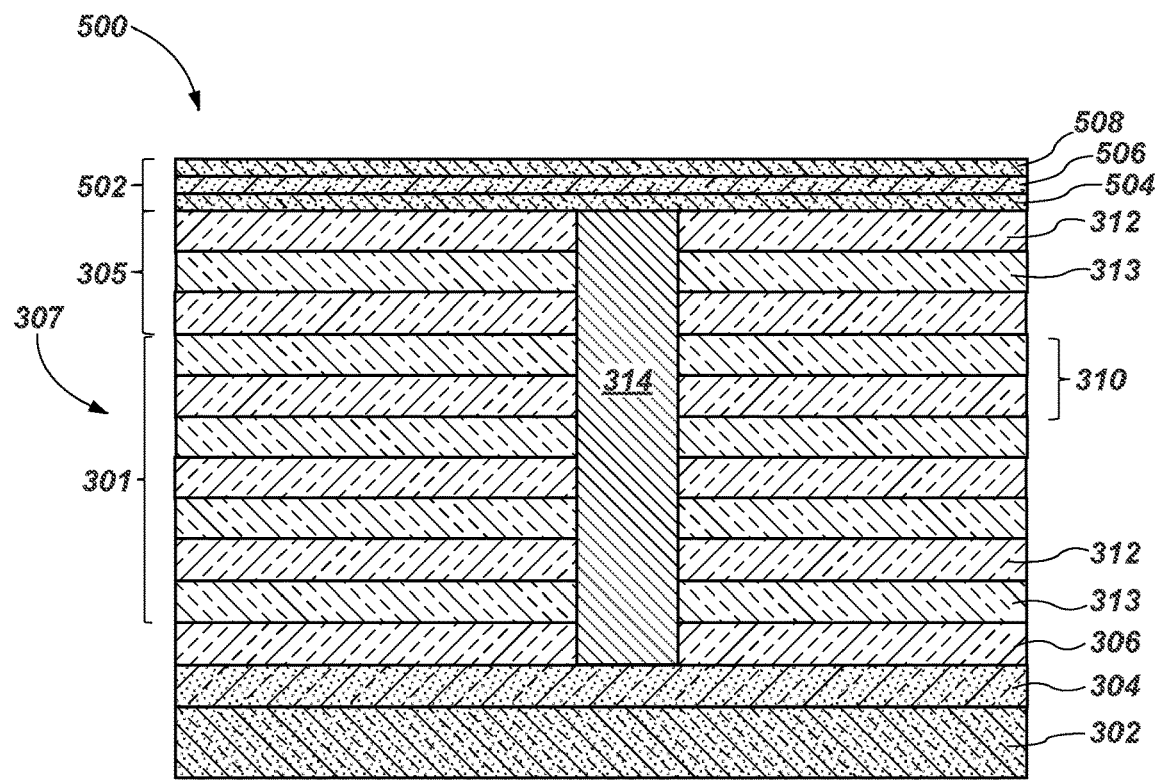
FIG. 5A through FIG. 5F are simplified cross-sectional views illustrating a method of forming a microelectronic device, in accordance with additional embodiments of the disclosure.

FIG. 5A through FIG. 5F illustrate a method of forming a microelectronic device structure 500, such as the microelectronic device 200 of FIG. 2, in accordance with embodiments of the disclosure. Referring to FIG. 5A, a microelectronic device structure 500 may be formed to be substantially the same as the microelectronic device structure 300 described above with reference to FIG. 3C.

After forming the first sacrificial material 314 and removing the first sacrificial material 314 from surfaces of the uppermost insulative material 312, a mask material 502 may be formed over the uppermost insulative material 312. The mask material 502 may include a first material 504, a second material 506 over the first material 504, and a third material 508 over the second material 506. The first material 504 may include, for example, a carbon material, such as a carbon-containing mask. The second material 506 may include a hardmask material, such as, for example, a dielectric anti-reflection coating (DARC). The third material 508 may include, for example, a photoresist material.

Figure 5B:
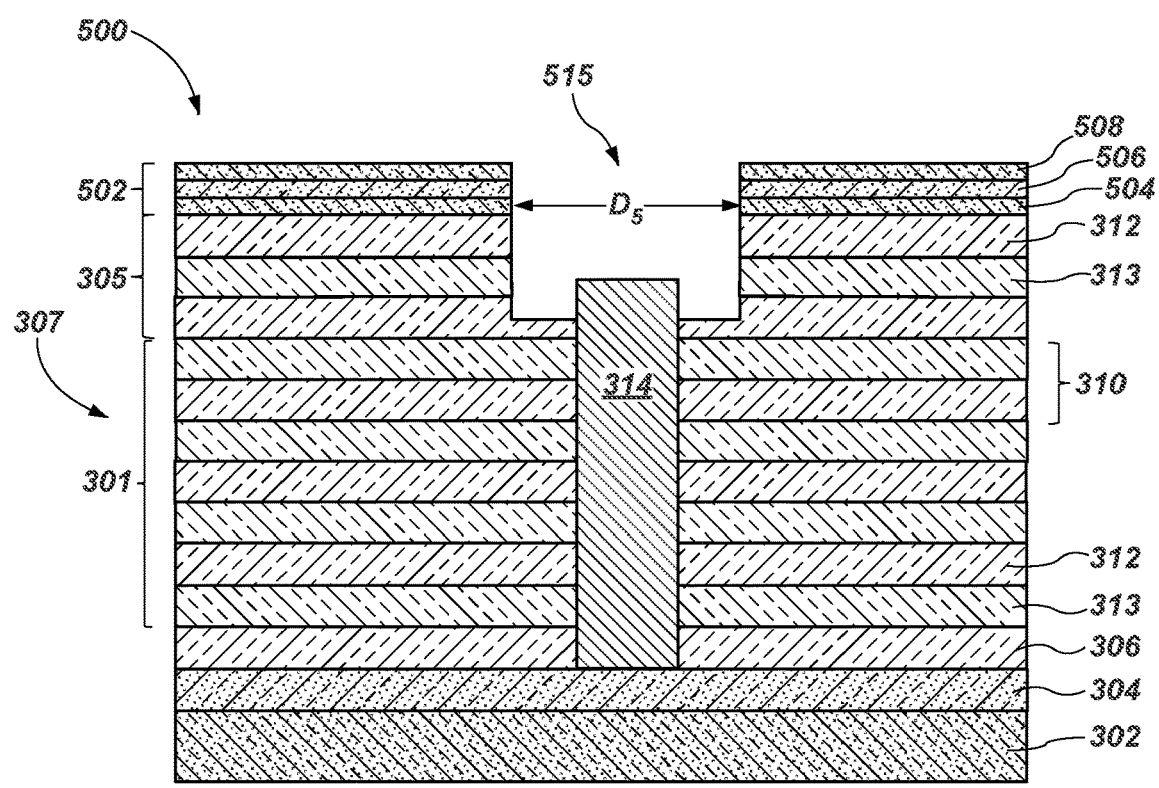

Referring to FIG. 5B, a recess 515 may be formed through the mask material 502 and through a portion of the interdeck region 305. A portion of the interdeck region 305 may be removed to form the recess 515. The recess 515 may extend through the uppermost insulative material 312, the adjacent other insulative material 313, and a portion of another of the insulative materials 312. After removing the portion of the interdeck region 305, a portion of the first sacrificial material 314 in the interdeck region 305 may be removed through the recess 515.

A diameter $D_5$ of the recess 515 may be greater than a diameter of the first sacrificial material 314 (FIG. 5B). The diameter $D_5$ may correspond to the diameter $D_3$ described above with reference to FIG. 2.

Figure 5C:
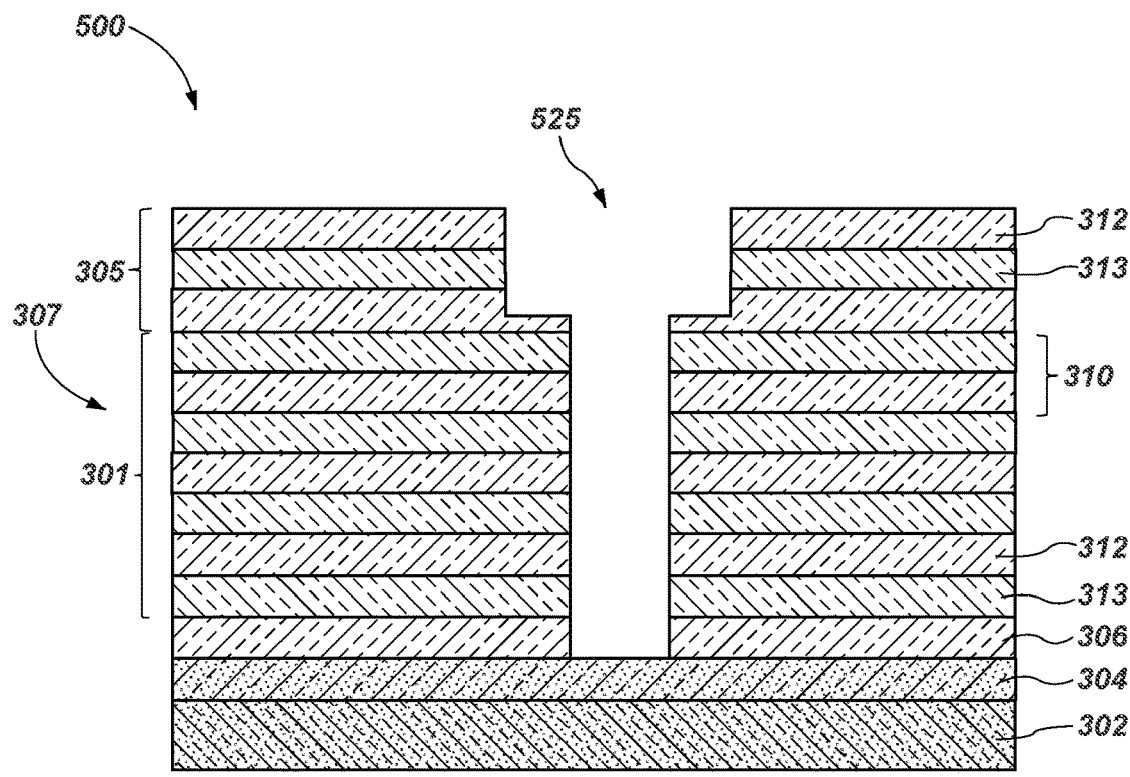

Referring to FIG. 5C, the mask material 502 (FIG. 5B) and remaining portions of the first sacrificial material 314 (FIG. 5B) may be removed from the microelectronic device structure 500. In some embodiments, the mask material 502 may be removed, such as by stripping the mask material 502. For example, the mask material 502 may be removed by exposing the mask material 502 to a solvent formulated to remove the mask material 502.

In some embodiments, the first sacrificial material 314 is removed by exposing the first sacrificial material 314 to a dry etchant comprising oxygen without substantially removing the other insulative material 313 or the insulative material 312, as described above with reference to FIG. 3E. Removal of the first sacrificial material 314 from the first deck structure 301 may leave an opening 525 extending through the first deck structure 301.

Figure 5D:
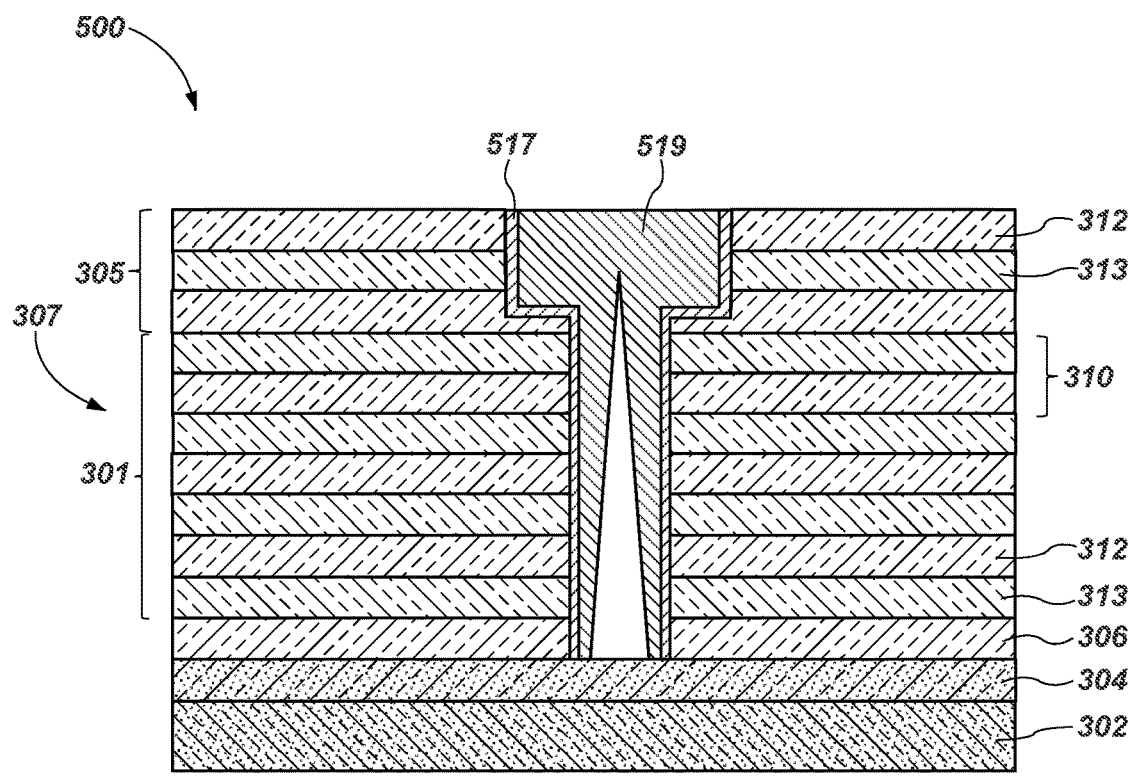

Referring to FIG. 5D, after removing the first sacrificial material 314, a second sacrificial material 517 may be formed within the opening 525 (FIG. 5C). The second sacrificial material 517 may be substantially the same as the second sacrificial material 317 described above with reference to FIG. 3E. For example, the second sacrificial material 517 may be formed sub-conformally within the opening 525. In some embodiments, the second sacrificial material 517 comprises titanium nitride.

After forming the second sacrificial material 517 within the opening 525 (FIG. 5C), a third sacrificial material 519 may be formed over the second sacrificial material 517 within the opening 525. The third sacrificial material 519 may be substantially the same as the third sacrificial material 319 described above with reference to FIG. 3E. For example, the third sacrificial material 519 may comprise tungsten and may be formed sub-conformally within the opening 525. Accordingly, a portion of the opening 525 may remain free of the second sacrificial material 517 and the third sacrificial material 519.

After forming the second sacrificial material 517 and the third sacrificial material 519, portions of the second sacrificial material 517 and the third sacrificial material 519 outside of the opening 525 may be removed. For example, the microelectronic device structure 500 may be exposed to a CMP process to remove portions of the second sacrificial material 517 and the third sacrificial material 519 from surfaces of the uppermost insulative material 312.

Figure 5E:
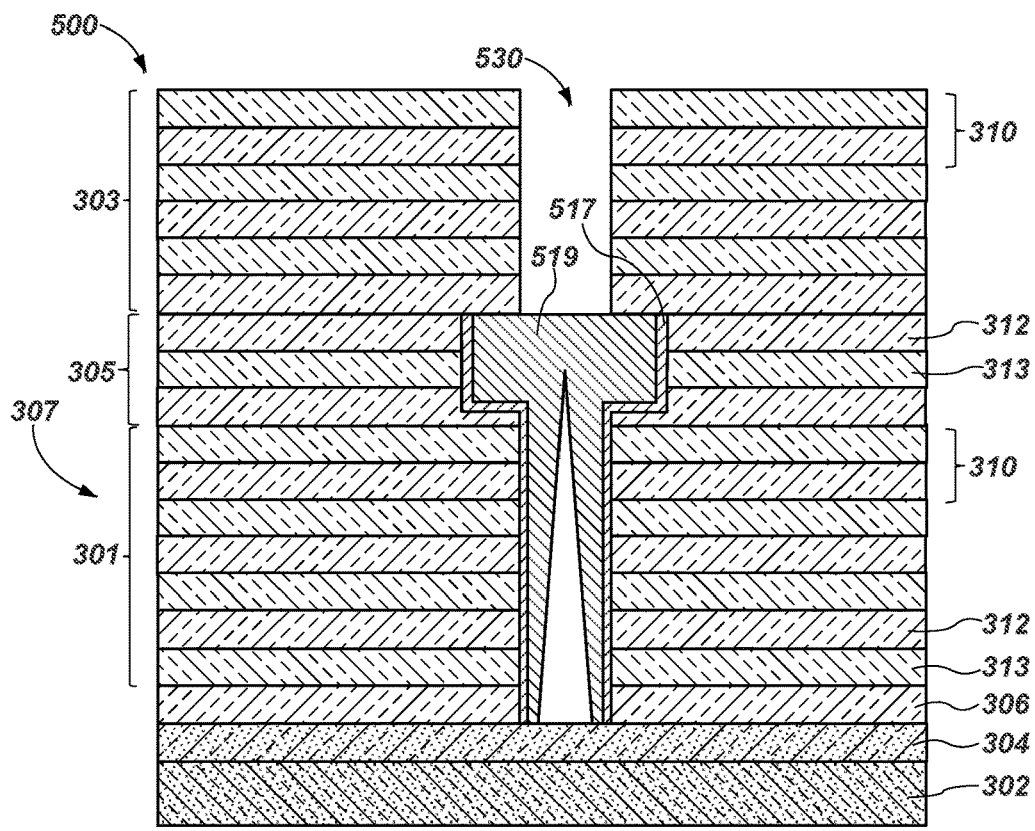

Referring to FIG. 5E, a second deck structure 303 may be formed adjacent to (e.g., over) the interdeck structure 305. The second deck structure 303 may include tiers 310 of the insulative material 312 and the other insulative material 313. After forming the second deck structure 303, an opening 530 may be formed through the tiers 310 of the second deck structure 303. The opening 530 may be formed in substantially the same manner as formation of the opening 315 (FIG. 3B).

The second sacrificial material 517 and the third sacrificial material 519 within the first deck structure 301 may protect the materials within the first deck structure 301 from undesired damage during formation of the opening 530 in the second deck structure 303.

Figure 5F:
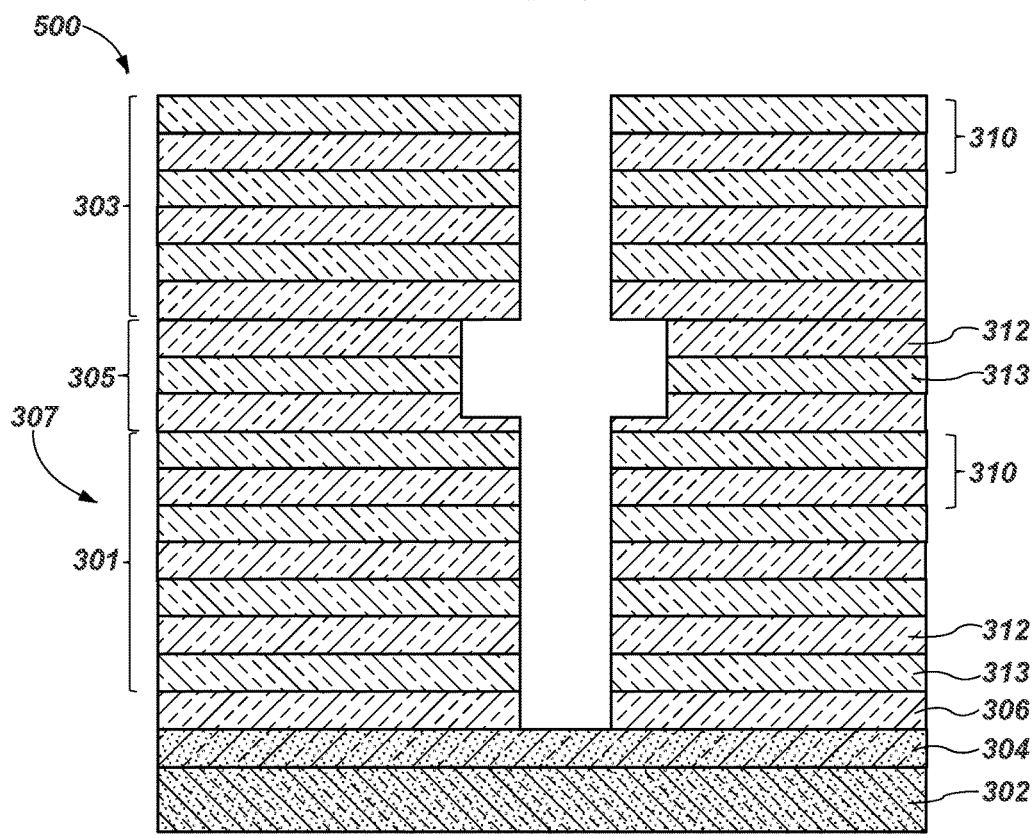

Referring to FIG. 5F, after forming the opening 530 in the second deck structure 303, the microelectronic device structure 500 may be exposed to additional processing acts to form the microelectronic device 200 of FIG. 2. For example, the third sacrificial material 519 and the second sacrificial material 517 may be removed from the first deck structure 301 through the opening 530. The third sacrificial material 519 and the second sacrificial material 517 may be removed by exposing the third sacrificial material 519 and the second sacrificial material 517 to a wet etchant, such as one or more of hydrofluoric acid, nitride acid, ammonium hydroxide, hydrogen peroxide, acetic acid, and water. However, the disclosure is not so limited and the third sacrificial material 519 and the second sacrificial material 517 may be removed using etch chemistries other than those described.

After removing the third sacrificial material 519 and the second sacrificial material 517, a channel material (e.g., the channel material 120 (FIG. 1A)) may be formed within opening extending through the second deck structure 303, the interdeck region 305, and the first deck structure 301. An electrically insulative material (e.g., the electrically insulative material 124 (FIG. 1A)) may be formed within the openings remaining between the channel material to form pillars (e.g., pillars 118 (FIG. 1A)).

After forming the pillars, the microelectronic device structure 500 may be further processed to form memory cells, as described above with reference to FIG. 3F, to form the microelectronic device 200 of FIG. 2. For example, slits (not shown) may be formed through the second deck structure 303, the interdeck structure 305, and the first deck structure 301. After forming the slits, the insulative materials 312 may be removed, such as by exposing the insulative materials 312 to a wet etch chemistry through the slits. The wet etch chemistry may comprise, for example, nitric acid. After removing the insulative materials 312, a dielectric material (e.g., the dielectric material 122 (FIG. 1A)) may be formed in at least some of the spaces left by removal of the insulative materials 312. A conductive material (e.g., the conductive material 114 (FIG. 1A)) may be formed adjacent to the dielectric material to form memory cells (e.g., memory cells 130 (FIG. 1A)). In other embodiments, memory cells, such as the memory cells 140 (FIG. 1C) may be formed rather than the memory cells 130.

After forming the memory cells, an insulative material (e.g., insulative material 132 (FIG. 1A)) may be formed over the microelectronic device structure 300. Openings may be formed in the insulative material at locations corresponding to the pillars (e.g., pillars 118 (FIG. 1A)) and filled with a conductive material to form conductive contacts (e.g., conductive contacts 134 (FIG. 1A)). A conductive line (e.g., conductive line 136 (FIG. 1A)) may be formed over the insulative material and may be electrically connected to the conductive contacts to form the microelectronic device 100 of FIG. 1A.

Figure 6A:
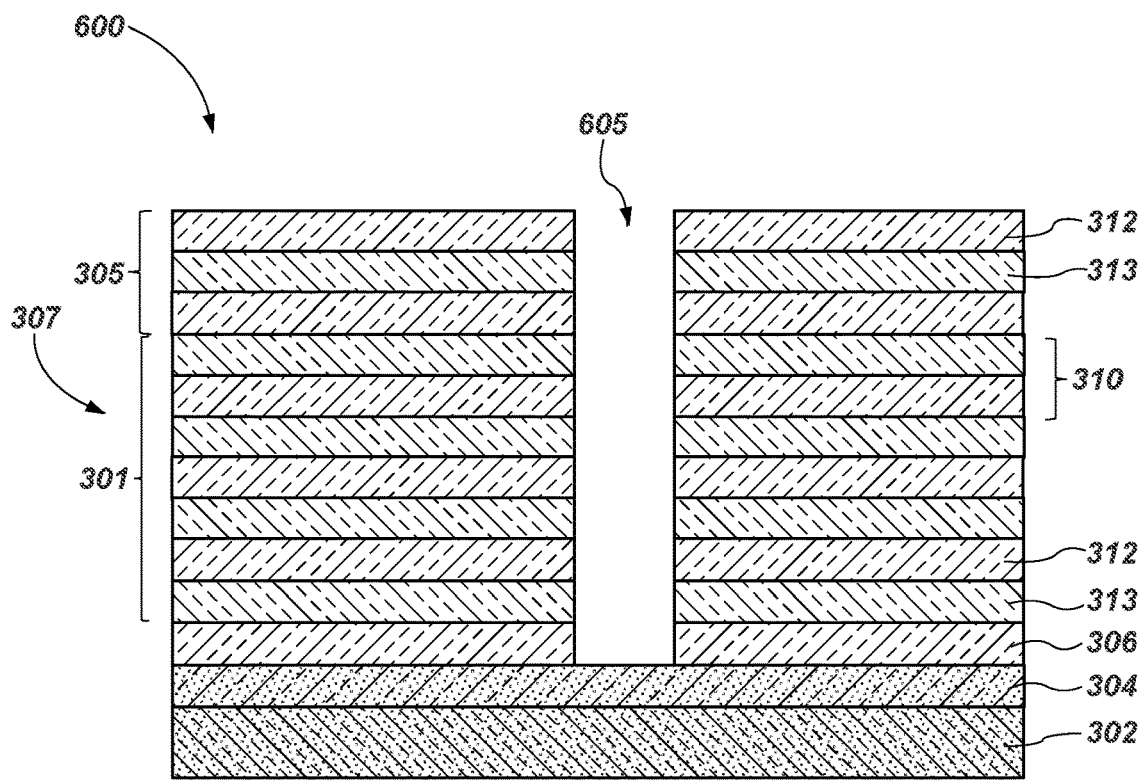
FIG. 6A through FIG. 6D are simplified cross-sectional views illustrating a method of forming a microelectronic device, in accordance with other embodiments of the disclosure.

FIG. 6A through FIG. 6D illustrate another method of forming a microelectronic device structure 600, such as the microelectronic device 200 of FIG. 2, in accordance with embodiments of the disclosure. Referring to FIG. 6A, a microelectronic device structure 600 may be formed to be substantially the same as the microelectronic device structure 300 described above with reference to FIG. 3C, except that the microelectronic device structure 600 may not include the first sacrificial material 314, but may include an opening 605 extending through the first deck structure 301 and the interdeck region 305.

Figure 6B:
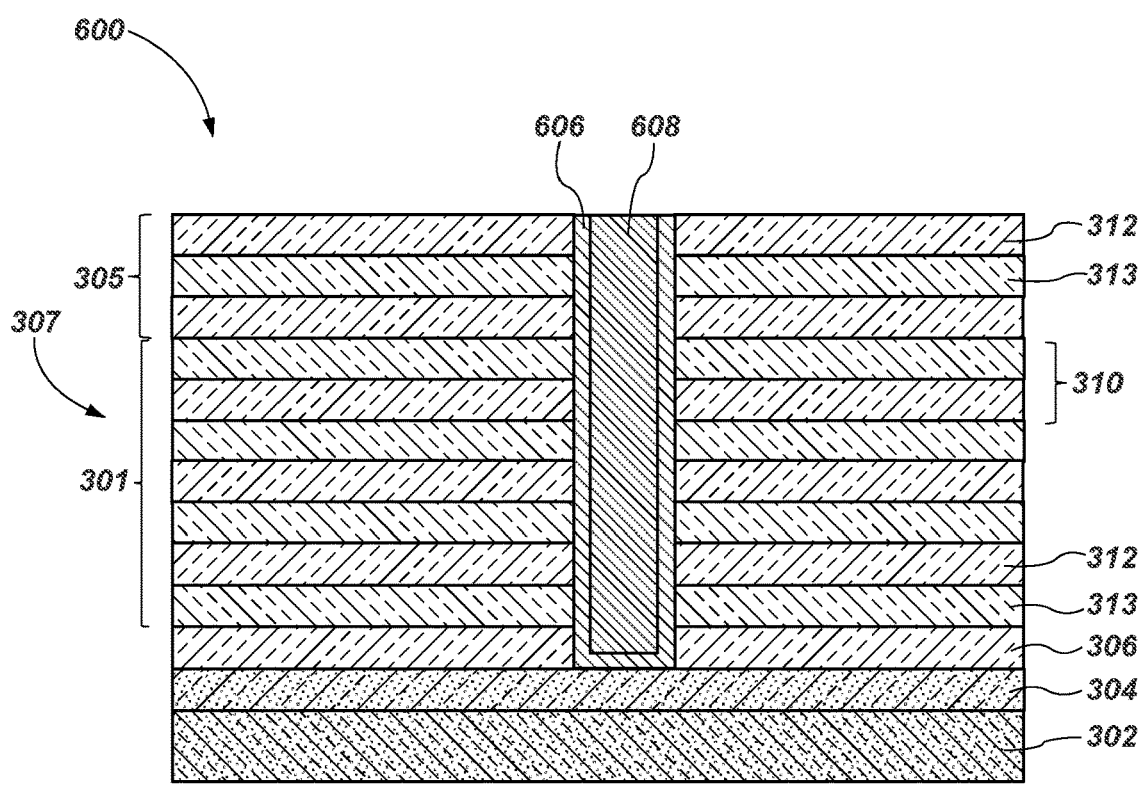

Referring to FIG. 6B, a first sacrificial material 606 may be formed within the opening 605. A second sacrificial material 608 may be formed adjacent to the first sacrificial material 606 and within remaining portions of the opening 605. The first sacrificial material 606 may comprise, for example, aluminum oxide. The second sacrificial material 608 may exhibit an etch selectivity with respect to the first sacrificial material 606, the insulative material 312, and the other insulative material 313. In some embodiments, the second sacrificial material 608 comprises tungsten.

Figure 6C:
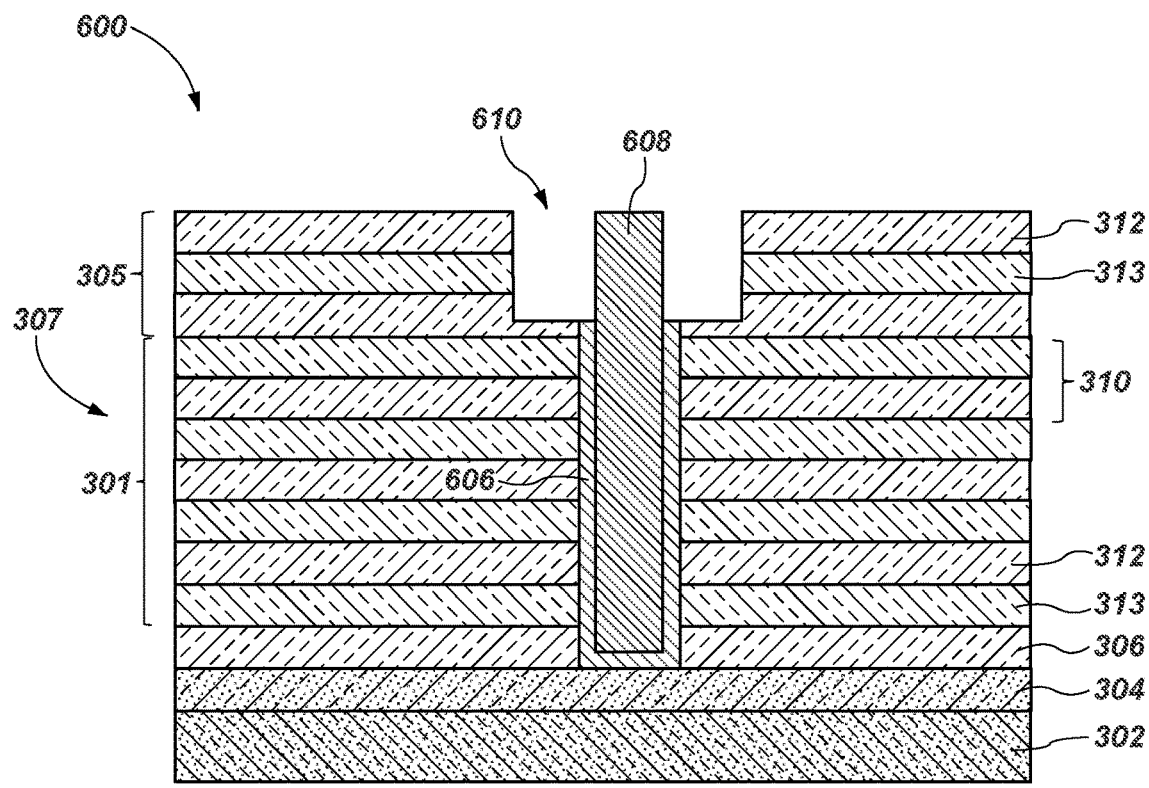

With reference to FIG. 6C, a portion of the first sacrificial material 606 in the interdeck region 305 may be removed to expose sidewalls of the insulative material 312 and the other insulative material 313 within the interdeck region 305. After removing the portion of the first sacrificial material 606, the exposed sidewalls of the insulative material 312 and the other insulative material 313 within the interdeck region 305 may be exposed to one or more etchants to remove portions (e.g., lateral portions) of the insulative material 312 and the other insulative material 313 within the interdeck region 305 and form openings 610 adjacent to upper portions of the second sacrificial material 608. The diameter of the opening 610 may correspond to the diameter $D_3$ described above with reference to FIG. 2.

Figure 6D:
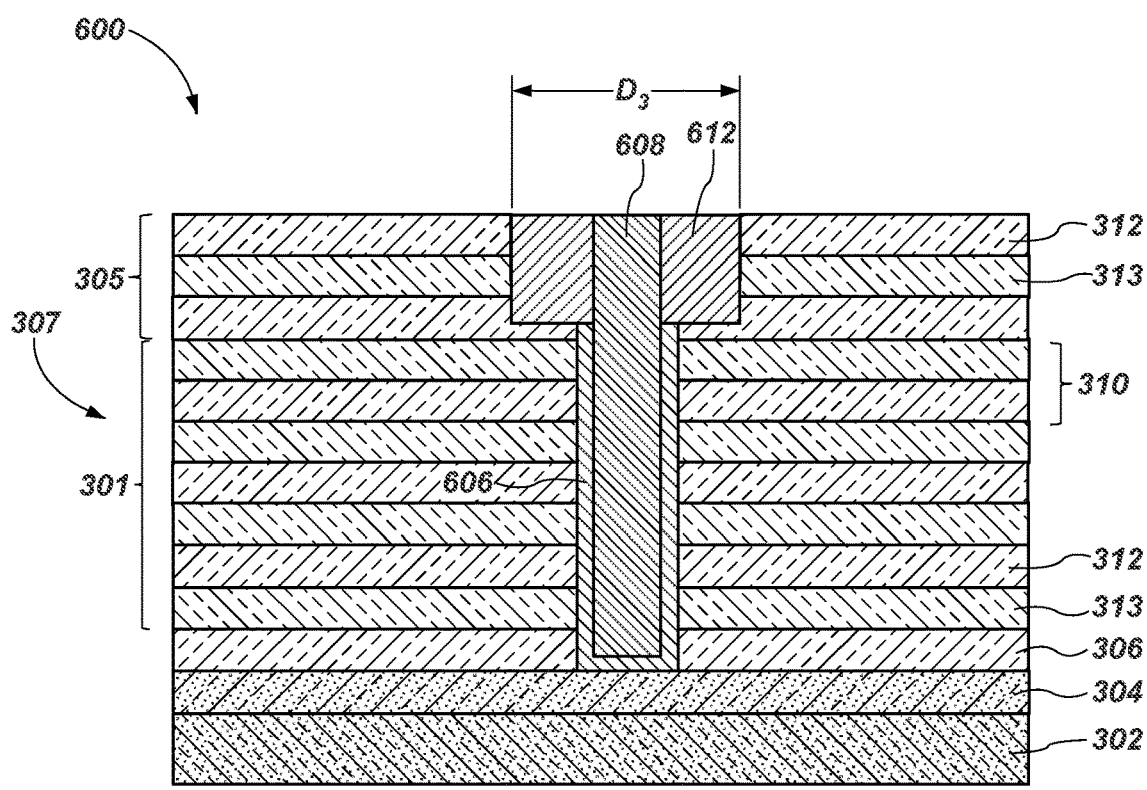

Referring to FIG. 6D, the openings 610 (FIG. 6C) may be filled with a third sacrificial material 612. The third sacrificial material 612 may comprise one or more of titanium nitride, polysilicon, and aluminum oxide. In some embodiments, the third sacrificial material 612 comprises titanium nitride. In other embodiments, the third sacrificial material 612 comprises the same material composition as the first sacrificial material 606.

After forming the third sacrificial material 612 within the opening 610, the second deck structure 303 may be formed over the interdeck structure 305, as described above with reference to FIG. 5E. Openings may be formed through the second deck structure 303 to expose the second sacrificial material 608 and the third sacrificial material 612 within the interdeck region 305. The second sacrificial material 608 and the third sacrificial material 612 may be removed. For example, the third sacrificial material 612 may be removed as described above with reference to removal of the second sacrificial material 517 (FIG. 5E). The second sacrificial material 608 may be removed as described above with reference to removal of the third sacrificial material 519 (FIG. 5E). After removing the third sacrificial material 612 and the second sacrificial material 608, the first sacrificial material 606 may be removed by, for example, exposing the first sacrificial material 606 to a dry etchant comprising one or more of $CF_4$, oxygen, $BCl_3$, $Cl_2$, $CCl_4$, $SiCl_4$, and argon. In other embodiments, the first sacrificial material 606 is removed by exposing the first sacrificial material 606 to a wet etchant comprising one or more of phosphoric acid, nitric acid, acetic acid, sulfuric acid, and tetramethylammonium hydroxide (TMAH).

After removing the third sacrificial material 612, the second sacrificial material 608, and the first sacrificial material 606, the microelectronic device structure 600 may be fabricated to form the microelectronic device 200 of FIG. 2, as described above with reference to FIG. 5F. For example, a channel material (e.g., the channel material 120 (FIG. 1A)) may be formed within opening extending through the second deck structure 303, the interdeck region 305, and the first deck structure 301. An electrically insulative material (e.g., the electrically insulative material 124 (FIG. 1A)) may be formed within the openings remaining between the channel material to form pillars (e.g., pillars 118 (FIG. 1A)).

After forming the pillars, the microelectronic device structure 600 may be further processed to form memory cells, as described above with reference to FIG. 3F to form the microelectronic device 200 of FIG. 2.

Accordingly, in some embodiments, a method of forming a microelectronic device comprises forming a first sacrificial material and a second sacrificial material in openings in an interdeck region and a first deck structure adjacent to the interdeck region, removing a portion of the first sacrificial material in the interdeck region to expose sidewalls of the interdeck region, removing a portion of the interdeck region, forming a third sacrificial material between the second sacrificial material and the interdeck region, the third sacrificial material having a greater dimension than the second sacrificial material, and forming a second deck structure over the interdeck region.

Although FIG. 3A through FIG. 6D have been described and illustrated as including forming the microelectronic device structures 300, 400, 500, 600 by a replacement gate process, the disclosure is not so limited. In other embodiments, the first deck structure 301 and the second deck structure 303 may include alternating levels of the insulative materials 312 and a conductive material. In other words, the microelectronic device structures 300, 400, 500, 600 may be formed with alternating levels of the insulative materials 312 and the conductive materials instead of the alternating levels of the insulative materials 312 and other insulative materials 313. In some such embodiments, the openings (e.g., openings 315, 325, 415, 425, 530, 605) may be formed in the microelectronic device structures 300, 400, 500, 600 through alternating levels of the insulative materials 312 and conductive materials and the microelectronic devices may be formed by a so-called "gate first" process.

The microelectronic device structures 300, 400, 500, 600 formed according to the methods described herein may comprise so-called 3D NAND Flash memory devices. The microelectronic device structures 300, 400, 500, 600 may include pillars (e.g., pillars 118 (FIG. 1A), 218 (FIG. 2)) that are wider within the interdeck region 305 than within the first deck structure 301 or the second deck structure 303. The methods and structures described herein may result in reduced interdeck wordline leakage (e.g., reduced current leakage between the conductive materials 114 (FIG. 1A, FIG. 2) of the first deck structure 101, 201 (FIG. 1A, FIG. 2) with the conductive materials 114 of the second deck structure 103, 203 (FIG. 1A, FIG. 2)). In addition, the pillars 118, 218 may be substantially vertical and the pillars 118, 218 may not exhibit damage from etching in the first deck structure 101, 201 since the microelectronic device structures 300, 400, 500, 600 are formed with the sacrificial materials, as described herein.

Figure 7:
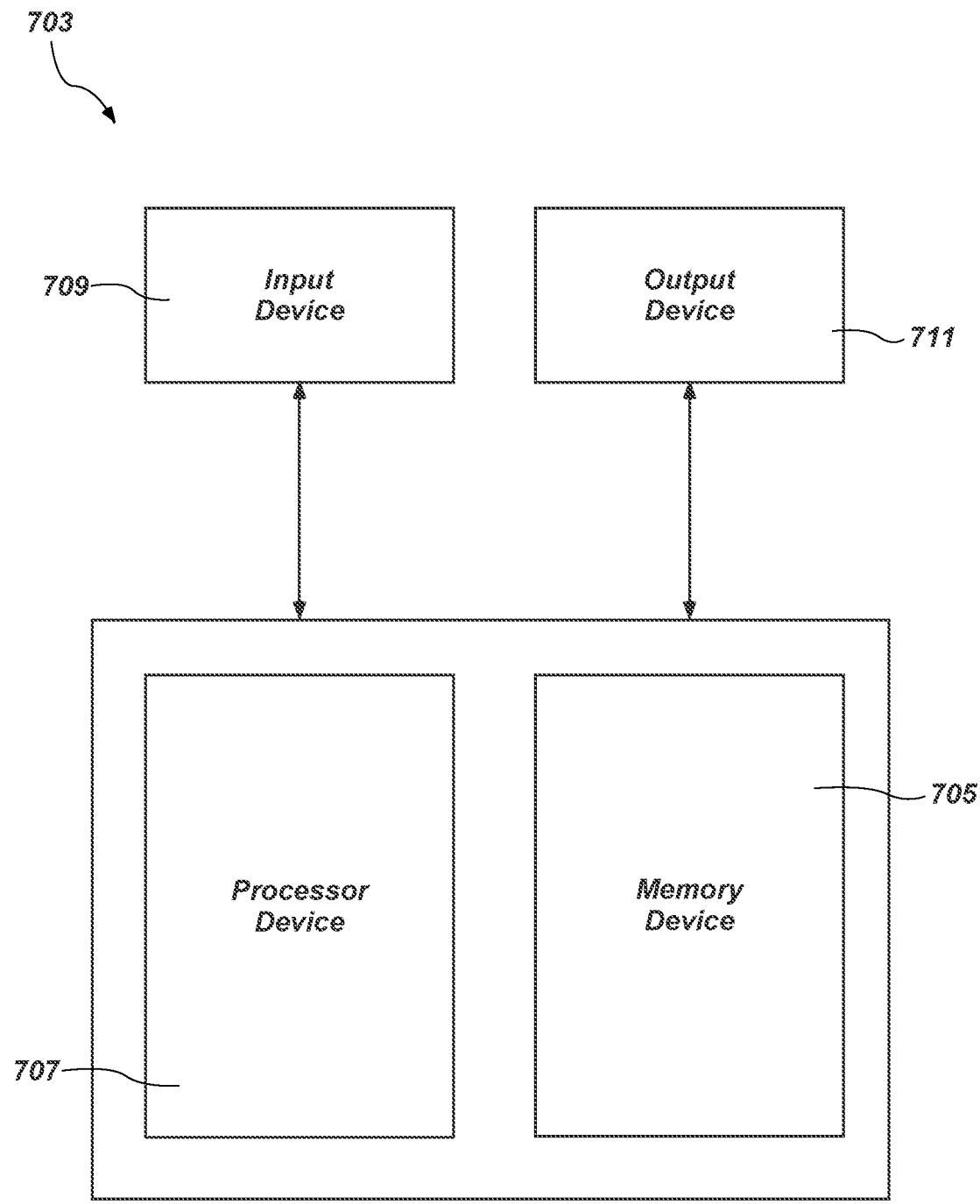
FIG. 7 is a block diagram of an electronic system, in accordance with embodiments of the disclosure.

Microelectronic devices (e.g., the microelectronic devices 100, 200) including an interdeck region (e.g., interdeck region 105, 205) between the first deck structures (e.g., first deck structures 101, 201) and second deck structures (e.g., second deck structures 103, 203), in accordance with embodiments of the disclosure, may be used in electronic systems. For example, FIG. 7 is a block diagram of an illustrative electronic system 703 according to embodiments of disclosure. The electronic system 703 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 703 includes at least one memory device 705. The memory device 705 may include, for example, an embodiment of a microelectronic device previously described herein (e.g., microelectronic devices 100, 200) including an interdeck region (e.g., the interdeck regions 105, 205) between adjacent decks (e.g., the first deck structures 101, 201 and the second deck structures 103, 203).

The electronic system 703 may further include at least one electronic signal processor device 707 (often referred to as a "microprocessor"). The electronic signal processor device 707 may, optionally, include an embodiment of a microelectronic device previously described herein (e.g., the microelectronic devices 100, 200). The electronic system 703 may further include one or more input devices 709 for inputting information into the electronic system 703 by a user, such as, for example, a mouse or other pointing device, a keyboard, a touchpad, a button, or a control panel. The electronic system 703 may further include one or more output devices 711 for outputting information (e.g., visual or audio output) to a user such as, for example, a monitor, a display, a printer, an audio output jack, a speaker, etc. In some embodiments, the input device 709 and the output device 711 may comprise a single touchscreen device that can be used both to input information to the electronic system 703 and to output visual information to a user. The input device 709 and the output device 711 may communicate electrically with one or more of the memory device 705 and the electronic signal processor device 707.

With reference to FIG. 8, depicted is a processor-based system 800. The processor-based system 800 may include various electronic devices manufactured in accordance with embodiments of the present disclosure. The processor-based system 800 may be any of a variety of types such as a computer, pager, cellular phone, personal organizer, control circuit, or other electronic device. The processor-based system 800 may include one or more processors 802, such as a microprocessor, to control the processing of system functions and requests in the processor-based system 800. The processor 802 and other subcomponents of the processor-based system 800 may include microelectronic devices (e.g., microelectronic devices 100, 200) manufactured in accordance with embodiments of the present disclosure.

The processor-based system 800 may include a power supply 804 in operable communication with the processor 802. For example, if the processor-based system 800 is a portable system, the power supply 804 may include one or more of a fuel cell, a power scavenging device, permanent batteries, replaceable batteries, and rechargeable batteries. The power supply 804 may also include an AC adapter; therefore, the processor-based system 800 may be plugged into a wall outlet, for example. The power supply 804 may also include a DC adapter such that the processor-based system 800 may be plugged into a vehicle cigarette lighter or a vehicle power port, for example.

Various other devices may be coupled to the processor 802 depending on the functions that the processor-based system 800 performs. For example, a user interface 806 may be coupled to the processor 802. The user interface 806 may include input devices such as buttons, switches, a keyboard, a light pen, a mouse, a digitizer and stylus, a touch screen, a voice recognition system, a microphone, or a combination thereof. A display 808 may also be coupled to the processor 802. The display 808 may include an LCD display, an SED display, a CRT display, a DLP display, a plasma display, an OLED display, an LED display, a three-dimensional projection, an audio display, or a combination thereof. Furthermore, an RF sub-system/baseband processor 810 may also be coupled to the processor 802. The RF sub-system/baseband processor 810 may include an antenna that is coupled to an RF receiver and to an RF transmitter (not shown). A communication port 812, or more than one communication port 812, may also be coupled to the processor 802. The communication port 812 may be adapted to be coupled to one or more peripheral devices 814, such as a modem, a printer, a computer, a scanner, or a camera, or to a network, such as a local area network, remote area network, intranet, or the Internet, for example.

The processor 802 may control the processor-based system 800 by implementing software programs stored in the memory. The software programs may include an operating system, database software, drafting software, word processing software, media editing software, or media playing software, for example. The memory is operably coupled to the processor 802 to store and facilitate execution of various programs. For example, the processor 802 may be coupled to system memory 816, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 816 may include volatile memory, non-volatile memory, or a combination thereof. The system memory 816 is typically large so that it can store dynamically loaded applications and data. In some embodiments, the system memory 816 may include microelectronic devices, such as the microelectronic devices (e.g., the microelectronic devices 100, 200) described above, or a combination thereof.

The processor 802 may also be coupled to non-volatile memory 818, which is not to suggest that system memory 816 is necessarily volatile. The non-volatile memory 818 may include one or more of STT-MRAM, MRAM, read-only memory (ROM) such as an EPROM, resistive read-only memory (RROM), and flash memory to be used in conjunction with the system memory 816. The size of the non-volatile memory 818 is typically selected to be just large enough to store any necessary operating system, application programs, and fixed data. Additionally, the non-volatile memory 818 may include a high-capacity memory such as disk drive memory, such as a hybrid-drive including resistive memory or other types of non-volatile solid-state memory, for example. The non-volatile memory 818 may include microelectronic devices, such as the microelectronic devices (e.g., the microelectronic devices 100, 200) described above, or a combination thereof.

Accordingly, in some embodiments, an electronic device comprises an input device, an output device, a processor device operably coupled to the input device and the output device, and a memory device operably coupled to the processor device. The memory device comprises an interdeck region between a first deck structure and a second deck structure, each of the first deck structure and the second deck structure comprising alternating levels of a conductive material and an insulative material, and channel materials extending through the second deck structure, the interdeck region, and the first deck structure, the channel materials having a larger diameter in the interdeck region than in the first deck structure and the second deck structure, sidewalls of the channel materials in the interdeck region oriented at an angle with respect to sidewalls of the channel materials in the first deck structure.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of forming a microelectronic device, the method comprising:
    forming openings in an interdeck region and a first deck structure, the first deck structure comprising alternating levels of a first insulative material and a second insulative material comprising a different material composition than the first insulative material;
    forming a first sacrificial material in the openings;
    removing a portion of the first sacrificial material from the interdeck region to expose sidewalls of the first insulative material and the second insulative material in the interdeck region;
    after removing the portion of the first sacrificial material, removing a portion of the first insulative material and the second insulative material in the interdeck region to form tapered sidewalls of each of the first insulative material and the second insulative material in the interdeck region;
    removing remaining portions of the first sacrificial material from the openings; and
    forming at least a second sacrificial material in the openings.

2. The method of claim 1, wherein forming at least a second sacrificial material in the openings comprises filling less than an entire volume of the openings with the at least a second sacrificial material, the at least a second sacrificial material defining a void at a lower portion of each opening.

3. The method of claim 1, wherein forming at least a second sacrificial material in the openings comprises forming a liner material comprising titanium nitride within the openings and forming a third sacrificial material comprising tungsten adjacent to the titanium nitride in the openings.

4. The method of claim 1, wherein removing a portion of the first insulative material and the second insulative material in the interdeck region comprises forming the tapered sidewalls to have an angle from about 2° to about 15° with respect to sidewalls of the first sacrificial material in the first deck structure.

5. The method of claim 1, further comprising, after forming the at least a second sacrificial material in the openings, forming a second deck structure over the first deck structure.

6. The method of claim 5, further comprising forming openings through the second deck structure while the at least a second sacrificial material is in the openings of the first deck structure.

7. The method of claim 6, further comprising removing the at least a second sacrificial material after forming the openings through the second deck structure.

8. The method of claim 1, wherein forming at least a second sacrificial material in the openings comprises forming the at least a second sacrificial material to have a larger dimension in the interdeck region than in the first deck structure.

9. The method of claim 1, further comprising:
    forming a second deck structure over the interdeck region;
    forming openings through the second deck structure;
    removing the at least a second sacrificial material from the first deck structure; and
    forming a channel material in the openings of the second deck structure, the interdeck region, and the first deck structure, the channel material having a larger diameter proximate the second deck structure than proximate the first deck structure.

10. The method of claim 1, wherein forming a first sacrificial material and forming at least a second sacrificial material comprises forming each of the first sacrificial material and the at least a second sacrificial material to extend to a lower portion of the openings.

11. The method of claim 1, wherein forming at least a second sacrificial material in the openings comprising forming the at least a second sacrificial material in the openings after removing the remaining portions of the first sacrificial material from the openings.

12. The method of claim 1, wherein forming at least a second sacrificial material in the openings comprises forming at least a second sacrificial material comprising tungsten in the openings.

13. A method of forming a microelectronic device, the method comprising:
    forming a first sacrificial material and a second sacrificial material in openings in an interdeck region and a first deck structure adjacent to the interdeck region;
    selectively removing a portion of the first sacrificial material in the interdeck region relative to the second sacrificial material to expose sidewalls of the interdeck region, an upper portion of the second sacrificial material extending vertically above an upper portion of remaining portions of the first sacrificial material;
    removing a portion of the interdeck region;
    forming a third sacrificial material in contact with sidewalls of the second sacrificial material and between the second sacrificial material and the interdeck region, the third sacrificial material having a greater dimension than the second sacrificial material; and
    forming a second deck structure over the interdeck region.

14. The method of claim 13, further comprising forming openings through the second deck structure to expose the second sacrificial material and the third sacrificial material.

15. The method of claim 14, further comprising, after forming openings through the second deck structure, removing the first sacrificial material, the second sacrificial material, and the third sacrificial material through the openings in the second deck structure.

16. The method of claim 15, wherein removing the first sacrificial material, the second sacrificial material, and the third sacrificial material comprises forming the openings in the interdeck region having a larger diameter than the openings in the first deck structure and the second deck structure.

17. The method of claim 16, wherein forming the openings in the interdeck region having a larger diameter than the openings in the first deck structure and the second deck structure comprises forming the openings in the interdeck region having the larger diameter to comprise a substantially uniform diameter.

18. The method of claim 15, further comprising forming a channel material extending through the second deck structure, the interdeck region, and the first deck structure, the channel material having a larger diameter in the interdeck region than in the first deck structure and the second deck structure.

19. The method of claim 13, wherein:
forming a first sacrificial material comprises forming aluminum oxide;
forming a second sacrificial material comprises forming tungsten; and
forming a third sacrificial material comprises forming titanium nitride.

20. A method of forming a microelectronic device, the method comprising:
forming a first sacrificial material comprising aluminum oxide in an opening extending through an interdeck region and a first deck structure, the interdeck region and the first deck structure comprising alternating first insulative materials and second insulative materials;
recessing the first sacrificial material in the interdeck region and a portion of the first insulative materials and the second insulative materials in the interdeck region to form a recessed portion in the interdeck region having a diameter larger than a diameter of the opening in the first deck structure;
filling the recess in the interdeck region with a second sacrificial material comprising tungsten; and
forming a second deck structure over the interdeck region and forming an opening through the second deck structure to expose the second sacrificial material.

21. The method of claim 20, further comprising:
removing the second sacrificial material and the first sacrificial material to form an opening extending through the second deck structure, the interdeck region, and the first deck structure; and
forming a channel region in the opening, the channel region comprising an angled sidewall in the interdeck region and having a larger diameter in the interdeck region than in the first deck structure and the second deck structure.

22. The method of claim 20, wherein forming a first sacrificial material in an opening extending through an interdeck region comprises forming the first sacrificial material in an opening extending through an interdeck region comprising alternating levels of silicon dioxide and silicon nitride.

23. The method of claim 20, wherein forming a recessed portion in the interdeck region comprises forming the interdeck region to have sidewalls oriented at an angle from about 2° to about 15° with respect to sidewalls of the opening in the first deck structure.

* * * * *